United States Patent [19]
Cox et al.

[11] Patent Number: 5,526,276
[45] Date of Patent: Jun. 11, 1996

[54] SELECT SET-BASED TECHNOLOGY MAPPING METHOD AND APPARATUS

[75] Inventors: William D. Cox, San Jose; Eric E. Lehmann, San Francisco; Mukesh T. Lulla, Santa Clara; Venkatesh R. Nathamuni, San Jose, all of Calif.

[73] Assignee: QuickLogic Corporation, Santa Clara, Calif.

[21] Appl. No.: 231,595

[22] Filed: Apr. 21, 1994

[51] Int. Cl.⁶ .................................................. G06F 17/10
[52] U.S. Cl. ........................ 364/489; 364/488; 364/490
[58] Field of Search ............................. 364/488, 489, 364/490, 491; 326/39, 41

[56] References Cited

U.S. PATENT DOCUMENTS

| | | | |
|---|---|---|---|
| 4,703,435 | 10/1987 | Darringer et al. | 364/489 |
| 4,792,909 | 12/1988 | Serlet | 364/491 |
| 4,825,105 | 4/1989 | Hölzle | 307/440 |
| 5,003,487 | 3/1991 | Drumm et al. | 364/489 |
| 5,005,136 | 4/1991 | Van Berkel et al. | 364/488 |
| 5,023,775 | 6/1991 | Poret | 326/39 |
| 5,029,102 | 7/1991 | Drumm et al. | 364/489 |
| 5,095,441 | 3/1992 | Hopper et al. | 364/488 |
| 5,151,867 | 9/1992 | Hooper et al. | 364/489 |
| 5,189,628 | 2/1993 | Olsen et al. | 326/39 |
| 5,212,650 | 5/1993 | Hooper et al. | 364/489 |
| 5,220,213 | 6/1993 | Chan et al. | 326/41 |
| 5,235,221 | 8/1993 | Douglas et al. | 326/41 |
| 5,237,513 | 8/1993 | Kaplan | 364/490 |
| 5,260,881 | 11/1993 | Agrawal et al. | 326/39 |
| 5,282,147 | 1/1994 | Goetz et al. | 364/489 |
| 5,282,148 | 1/1994 | Poirot et al. | 364/491 |
| 5,309,046 | 5/1994 | Steele | 326/39 |
| 5,311,442 | 5/1994 | Fukushima | 364/488 |
| 5,359,537 | 10/1994 | Saucier et al. | 364/489 |
| 5,359,539 | 10/1994 | Matsumoto et al. | 364/489 |

OTHER PUBLICATIONS

Devadas et al., "Boolean Decomposition of Programmable Logic Arrays", 1988 IEEE Custom IC Conf, pp. 2.5.1–2.5.5.

Cong et al., "An improved graph–based FPGA technology–based mapping algorithm", Computer Design—ICCD '92, 1992 Int'l Conf.

Mailhat et al., "Algorithms for Technology Mapping based on BDD's and on Boolean Operations", IEEE on CAD & ICs, May 1993, vol. 12, No. 5.

Chaudhary et al, "A near optional algorithm for Technology Mapping Minimizing Area . . . ", 1992 IEEE/ACM Design Automation Conf.

(List continued on next page.)

*Primary Examiner*—Kevin J. Teska
*Assistant Examiner*—Tyrone V. Walker
*Attorney, Agent, or Firm*—Skjerven, Morrill, MacPherson, Franklin & Friel; Alan H. MacPherson; T. Lester Wallace

[57] ABSTRACT

A logic circuit is implemented on a macrocell of a field programmable device using select sets of a logic function which represents a transformation of the one or more input signals of the logic circuit to the output signal of the logic circuit. Select sets of a logic function are determined (i) by grouping input signals which correspond to equal co-factors of the logic function or (ii) by grouping input signals such that one input signal of a group never appears in a term of the logic function in a greedy phase-minimized RMF canonical form without all other input signals of the group. The logic circuit is implemented on a macrocell which includes a circuit element which selects one of two or more input signals according to one or more select signals, each of which is driven by a respective logic gate. Examples of such circuit elements include multiplexers and random access memory (RAM). The logic circuit is implemented by placing on input lines of a logic gate driving a select line the input signals or the complement of the input signals of a select set.

32 Claims, 13 Drawing Sheets

Microfiche Appendix Included
(373 Microfiche, 4 Pages)

OTHER PUBLICATIONS

Zhu et al., "On the optimization of MOS circuits", IEEE Trans on Circuits & Systems, Pt. I, Jun. 1993, vol. 40, No. 6.

Brayton et al., "MIS: A Multiple–Level Logic Optimization System", IEEE Trans on CAD, vol. CAD–6, No. 6, Nov. 1987, pp. 1062–1081.

Detjens et al., "Technology Mapping in MIS", IEEE, May 1987, pp. 116–119.

Francis et al., "Chortle: A Technology Mapping Program for Lookup Table–Based Field Programmable Gate Arrays", IEEE DAC, 1990.

Micheli, "Technology Mapping of Digital Circuits", IEEE Euro. Computer, Conf, May 1991, pp. 580–586.

"Multi–Level Logic Synthesis", R. K. Brayton et al., Oct. 4, 1989, pp. 49–53.

"Logic Synthesis for Programmable Gate Arrays—Category 4.1: Logic Synthesis and Optimization", Rajeev Murgai et al., pp. 1–28.

"Synthesis Methods for Field Programmable Gate Arrays", Alberto Sangiovanni–Vincentelli et al., Proceedings of the IEEE vol. 81, No. 7, Jul. 1993, pp. 1057–1083.

"Efficient Boolean Function Matching", Jerry R. Burch et al., Apr. 13, 1992, pp. 1–16.

"Algorithmic Graph Theory", James A. McHugh, 1990 by Prentice–Hall, Inc., pp. 56–61.

QuickLogic Data Book, "Very High Speed FPGAs", pp. 3–3 through 3–7.

*Practical Design Using Programmable Logic,* David Pellerin et al., 1991 by Prentice–Hall, Inc., pp. 130–132.

*Field–Programmable Gate Arrays,* Stephen D. Brown et al., 1992 by Kluwer Academic Publishers, Second Printing, 1993, pp. 45–86.

*Field–Programmable Gate Array Technology,* Stephen M. Trimberger, 1994 by Kluwer Academic Publishers, 54–60.

*Actel FPGA Data Book and Design Guide,* 1994, pp. 5–21 through 5–22 and 7–17 through 7–20.

*Actel ACT™ 2 Field Programmable Gate Arrays,* Mar. 1993, pp. 1–63.

*Actel ACT™ 3 Field Programmable Gate Arrays,* Jan. 1993, pp. 1–55.

*pASIC Toolkit User's Guide,* Jan. 1993, [particular attention is to be paid to pp. 146–148 and 223–227].

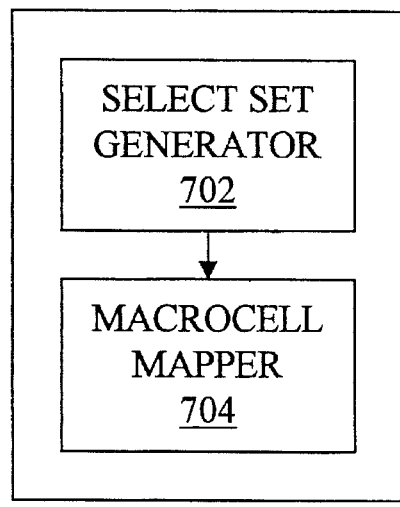
Fig. 7
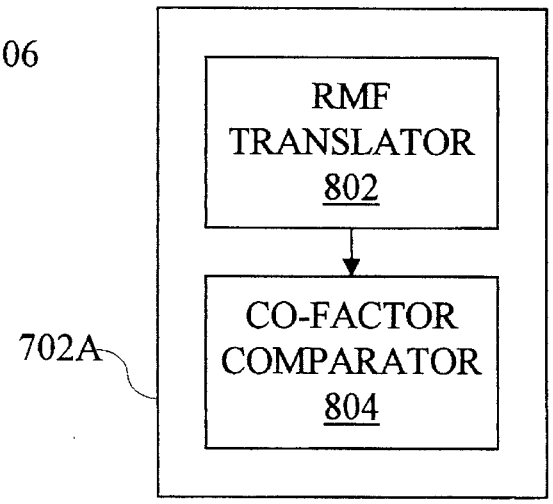
Fig. 8
$f = abcd \oplus acd \oplus bcd$
$f_a = bcd \oplus cd \oplus bcd = cd$
$f_{\bar{a}} = 0 \oplus 0 \oplus bcd = bcd$
$f_b = acd \oplus acd \oplus cd = cd$
$f_{\bar{b}} = 0 \oplus acd \oplus 0 = acd$
$f_c = abd \oplus ad \oplus bd$
$f_{\bar{c}} = 0 \oplus 0 \oplus 0 = 0$
$f_d = abc \oplus ac \oplus bc$
$f_{\bar{d}} = 0 \oplus 0 \oplus 0 = 0$
Fig. 9
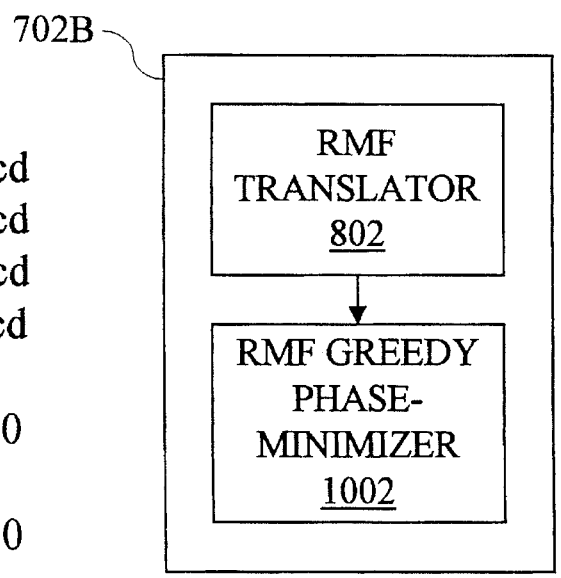
Fig. 10

$f = ab \oplus ac \oplus c$; select sets are $\{\bar{a}\}$, $\{\bar{b}\}$, and $\{\bar{c}\}$ $\text{input}_0 = f(a=0) = 0 \oplus 0 \oplus 0 = 0$
$\text{input}_1 = f(a=1) = b \oplus c \oplus c = b$ $f = efab \oplus efcd \oplus cd$; select sets are $\{\bar{a},\bar{b}\}$, $\{\bar{c},\bar{d}\}$, and $\{\bar{e},\bar{f}\}$ $\text{input}_0 = f(e=0 \text{ or } f=0) = 0 \oplus 0 \oplus cd = cd$
$\text{input}_1 = f(e=f=1) = ab \oplus cd \oplus cd = ab$

SELECT SET-BASED TECHNOLOGY MAPPING METHOD AND APPARATUS

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS REFERENCE TO MICROFICHE APPENDIX

Microfiche Appendix A consists of four (4) sheets of 373 frames of microfiche submitted under 37 C.F.R. § 1.96 and is a part of this disclosure. Microfiche Appendix A includes computer source code written in the C computer programming language which, when compiled as described below, forms a technology mapper in accordance with the present invention.

FIELD OF THE INVENTION

The present invention relates to automated circuit design and, in particular, to the implementation of digital circuits onto programmable integrated circuits consisting of arrays of identical logic blocks.

BACKGROUND INFORMATION

A field programmable device, FPD, (or a so-called "field programmable gate array") is a versatile integrated circuit chip which includes an array of identical logic blocks (herein referred to as macrocells). The internal circuitry of the FPD can be configured by an individual user to realize a user-specific circuit. To configure an FPD, the user configures an on-chip interconnect structure of the FPD (so-called "programming of the FPD") so that selected inputs and outputs of selected macrocells are connected together in such a way that the resulting circuit is the user-specific circuit desired by the user. Given that the programming of FPDs can typically be performed by the end user in minutes, the use of FPDs can result in a dramatic decrease in the turn-around time and cost associated with the design of application-specific integrated circuits.

Several computer-aided design (CAD) systems have been designed to automate the process of implementing ("mapping") logic circuits onto the FPDs of various vendors. Typically, such CAD systems perform a logic optimization step followed by a technology mapping step. During the logic optimization step, the logic circuit, which is typically represented as a graph (called a netlist) whose nodes represent Boolean functions, is simplified through the use of techniques that are independent of the specific FPD on which the circuit is to be implemented. Such techniques include, for example, the removal of common subexpressions.

The technology mapping step determines the interconnections required to implement the netlist produced by the logic optimization step on the target FPD. Some methods used to perform technology mapping involve the covering of the netlist with pattern graphs chosen from a library of pattern graphs, each of which represents a function that can be implemented on one macrocell. Depending on its complexity, the function, may be represented by more than one pattern graph.

Library-based methods perform poorly when applied to complex macrocells. The set of pattern graphs corresponding to functions implementable on a macrocell of sufficient complexity is too large to be entirely stored in the pattern graph library. A library of such size would result in an unacceptably slow technology mapping step for all but the simplest circuits. As a result, the pattern graph library is typically restricted to the pattern graphs for a subset of the functions implementable on a complex macrocell. This results in less dense implementations since clusters of gates in the netlist corresponding to functions not represented in the library of pattern graphs but nevertheless implementable on one macrocell are implemented on two or more macrocells.

SUMMARY OF THE INVENTION

In accordance with this invention, methods for implementing a logic circuit onto one or more macrocells of a field programmable device (FPD) provide, in one embodiment, clusters of logic gates constituting components of the logic circuit which are implemented onto respective macrocells of the FPD through the use of select sets of the respective logic functions that represent the clusters.

A select set of a logic function is made up of one or more members, each of which is either an input signal of the logic function or the logical complement of an input signal of the logic function. The collective impact of the members of the select set on the value of the logic function is fully described by two cases, i.e. the case where at least one member of the select set is a logical one and the case where each member of the select set is a logical zero.

A first method for determining select sets in accordance with this invention, groups input signals to the logic function and/or logical complements of these input signals whose corresponding function co-factors are equal. A second method determines the greedy phase-minimized Reed-Muller form (RMF) for the logic function and then determines select sets by grouping input signals to the logic function and/or logical complements of the function's input signals that always appear together in the RMF expression for the logic function. This latter method provides a technique that is generally more efficient than co-factor comparison for determining select sets of a logic function.

In one embodiment, the FPD macrocell includes a multiplexer with n select lines, each of which is driven by the output of a respective one of n AND gates. In accordance with this invention, a logic circuit can be implemented on such a macrocell, given a complete set of n or fewer select sets for the logic function representing the logic circuit. Similarly, this method can implement on such a macrocell a logic function possessing exactly n multivariable select sets.

The method involves a first step of, for each of the n or fewer select sets in the complete set of select sets (or for each of n multivariable select sets, when given a function that has exactly n multivariable select sets), placing the logical complements of the signals contained in the select set on the input lines of a respective one of the AND gates. The method further involves a second step of, on each of the input lines of the multiplexer, placing the output signal produced by the logic circuit when logical one is the value of each of the signals placed in the first step on an AND gate whose output carries a logical value of one if the input line of the multiplexer is selected and when logical zero is the value of at least one signal in each group of signals placed in the first step on an AND gate whose output carries a logical value of zero if the input line of the multiplexer is selected.

A similar method is also disclosed for the implementation of a logic function possessing exactly n multivariable select sets or possessing a complete set of n or fewer select sets on a macrocell that includes a multiplexer with n select lines, each of which is driven by the output of a respective one of n OR gates.

A similar method is also provided for the implementation of a logic function possessing a complete set of n or fewer select sets on a macrocell that includes a random access memory (RAM) or read only memory (ROM) with $2^n$ 1-bit storage locations and n AND (or OR) gates, each of which drives a respective one of n memory address lines.

A method is also provided for implementing on a multiplexer with n select lines, each of which is driven by the output of a respective one of n AND or OR gates, a function, f, that possesses a complete set of more than n select sets, where no more than n of these select sets are multivariable. The corresponding above-mentioned method for implementing functions with a complete set of n or fewer select sets is applied, trying in any order every combination of n select sets chosen from a complete set of select sets for function f until all combinations have been tried or an implementation has been achieved. Only combinations containing every multivariable select set are considered. A successful implementation is achieved when the expression calculated for the signal on each multiplexer input line contains no more than one of function f's input signals.

A similar method is also disclosed for implementing a logic circuit on a multiplexer with n select lines driven by the outputs of AND or OR gates and possibly with logic circuitry driving the multiplexer's $2^n$ input lines, where the logic function, f, representing the logic circuit possesses a complete set of more than n select sets. The method described above for the case of the logic function to be implemented possessing a complete set of exactly n select sets is applied to each combination of n select sets, chosen from a complete set of more than n select sets for function f, until a successful combination is found or no more combinations remain to be tested. A successful combination results when the signal determined for each multiplexer input line can be implemented, given the complexity of the expression representing the signal and the logic circuitry, if any, present on the input lines of the multiplexer.

The disclosed methods represent an improvement over library-based mapping techniques in the prior art, which, for efficiency reasons, must restrict the size of the pattern graph library when the number of functions implementable on one macrocell is too large. Such prior art methods often result in the implementation of a cluster of gates onto two or more macrocells even though the cluster could have been implemented on one macrocell. This occurs if the logic function corresponding to the cluster of gates is not represented in the pattern graph library.

The disclosed technology mapping, which is based on select sets, does not suffer from this problem as the disclosed technology mapping does not match portions of the logic circuit with specifically enumerated pattern graphs stored in a library. As a result, the disclosed technology mapping produces, for sufficiently complex macrocells (such as the pASIC macrocell of the FPD sold by QuickLogic Corporation of Santa Clara, Calif., shown in FIG. 1 which can implement more than 60,000 logic functions), one-macrocell implementations for clusters of gates that would be implemented by a library-based technique on two or more macrocells. Macrocell 100 (FIG. 1) is described more completely in U.S. Pat. No. 5,122,685 to Chan et al., and that discussion, as well as U.S. Pat. No. 5,122,685 in its entirety, is incorporated herein by reference.

FIG. 2 compares, for each of nine logic circuit designs, the number of pASIC macrocells used to map the design using a library-based technique with the number of pASIC macrocells in the mapping produced by a select set-based mapping technique when applied to the mapped design produced by the library-based technique. Columns A in FIG. 2 represent the number of macrocells used to map each of the nine logic circuit designs using a library-base technique. Columns B represent the number of macrocells used to map each of those nine logic circuit designs after application of a select set-based technique. As illustrated in FIG. 2, the further use of a select-set based technique typically reduced the number of macrocells required for the final implementation by more than 50 percent.

The methods of this invention yield logic structures which implement given logic functions with fewer macrocells in general than prior art design techniques.

BRIEF DESCRIPTION OF THE DRAWINGS

FIG. 7 is a block diagram of a cluster implementer in accordance with the principles of the present invention.

FIG. 8 is a block diagram of one embodiment of a cluster implementer that performs co-factor comparison in accordance with the principles of the present invention.

FIG. 9 is an illustration of the determination of the co-factors of a logic function.

FIG. 10 is a block diagram of one embodiment of a cluster implementer that performs greedy phase-minimization in accordance with the principles of the present invention.

DETAILED DESCRIPTION

The following description is intended to be illustrative of the invention and should not be taken to be limiting.
Introduction In accordance with the principles of the invention, components of a logic circuit are each implemented on a separate macrocell of an FPD. For each component, a corresponding logic function represents a transformation of one or more input signals of the component to an output signal of the component. Each component is implemented through the use of one or more select sets of the logic function corresponding to the component. Select sets of a logic function f, which are precisely defined further below, are groups of input signals of function f and/or the logical complements of the input signals of function f.

The collective impact of the members of a select set of a logic function on the value of the logic function is fully described by two cases: (i) the case where at least one member of the select set is a logical one and (ii) the case where each member of the select set is a logical zero. Thus, the collective role of the signals in the select set in determining the value of the logic function can be captured (i) by the output of an OR gate on whose input lines the signals in the select set are respectively placed or (ii) alternatively by the output of an AND gate on whose input lines the respective logical complements of the signals in the select set are respectively placed.

The use of the output signal of the above OR (or AND) gate in the implementation of the logic function depends on the contents of the relevant macrocell. For example, if the macrocell includes a multiplexer, then the output of the above OR (or AND) gate could be connected to a select line of the multiplexer.

Implementing A Netlist on One or More Macrocells

Figure 3:
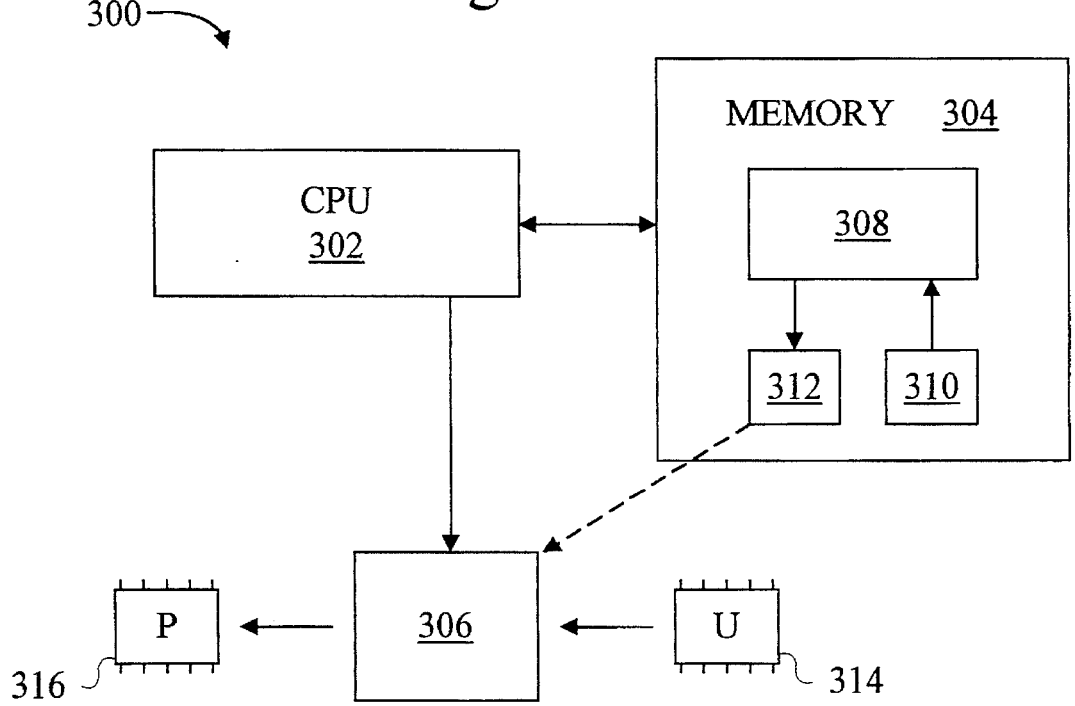
FIG. 3 is a block diagram of a computer which contains a technology mapper in accordance with the principles of the present invention.

A computer 300 (FIG. 3) includes a central processing unit (CPU) 302 which retrieves and executes instructions from a memory 304 in the conventional manner. Memory 304 can include any and all of the following: randomly-accessible memory (RAM), read only memory (ROM), and non-volatile memory such as magnetic disks. Memory 304 contains an FPD design implementer 308, which is a computer process executing in CPU 302.

FPD design implementer 308 retrieves from memory 304 a netlist description 310 and stores within memory 304 programmable array programming data 312. Programmable array programming data 312 contains instructions which are transmitted through CPU 302 to an FPD programmer 306 and which are used by FPD programmer 306 to program FPDs. For example, FPD programmer 306, in response to instructions contained within programmable array programming data 312, programs an unprogrammed FPD 314 to produce a programmed FPD 316. The programming of an FPD is described in U.S. Pat. No. 5,293,133 to Birkner et al., which is incorporated herein by reference. The programming of FPDs is further described in the following U.S. patent documents, and the discussion of FPD programming in each is incorporated herein by reference: (i) U.S. patent application Ser. No. 07/937,331, entitled "Programmed Programmable Device and Method for Programming Antifuses of a Programmable Device" by William D. Cox et al.; (ii) U.S. patent application Ser. No. 07/907,904, entitled "Field Programmable Antifuse Device and Programming Method Therefor" by William D. Cox; and (iii) U.S. Pat. No. 5,302,546 to Gordon et al. In one embodiment, programmable array programming data 312 is stored according to the QuickLogic Design Interchange Format described in Appendix D of *pASIC Toolkit User's Guide* published by QuickLogic Corporation of Santa Clara, Calif. (1993), which is incorporated herein by reference.

Figure 4:
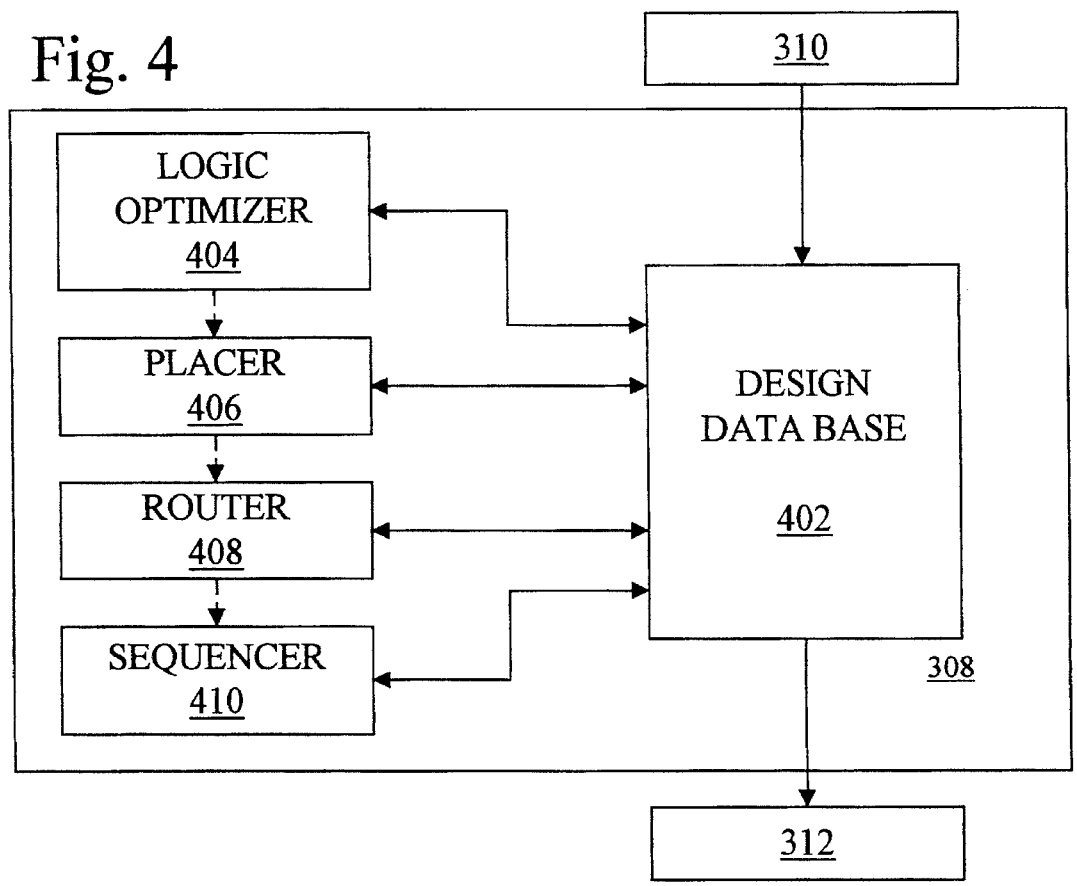
FIG. 4 is a block diagram of an FPD design implementer in accordance with the principles of the present invention.

FPD design implementer 308 is shown in greater detail in FIG. 4. FPD design implementer 308 includes a design database 402 which maintains data structures representing netlist description 310. FPD design implementer 308 also includes a logic optimizer 404, a placer 406, a router 408, and a sequencer 410, each of which accesses the data structures maintained in design database 402.

Logic optimizer 404 maps the logic circuit described by netlist description 310 onto one or more macrocells. A mapping or implementation of a logic circuit onto an array of macrocells refers to the placement of the input signals of the logic circuit and of various outputs of macrocells in the array onto the inputs of macrocells in the array in such a way that the array of macrocells realizes the desired logic circuit. Logic optimizer 404 is described in greater detail below. Placer 406 selects which of the macrocells of unprogrammed FPD 314 (FIG. 3) are used to implement the logic circuit of netlist description 310 as optimized and mapped by logic optimizer 404 (FIG. 4). Router 408 specifies the interconnections within unprogrammed FPD 314 (FIG. 3) of the macrocells selected by placer 406 (FIG. 4). Sequencer 410 determines the order in which the interconnections specified by the router are programmed by FPD programmer 306. FPD design implementer 308 builds from the data structures within design database 402, as processed by logic optimizer 404, placer 406, router 408, and sequencer 410, programmable array programming data 312.

Figure 5:
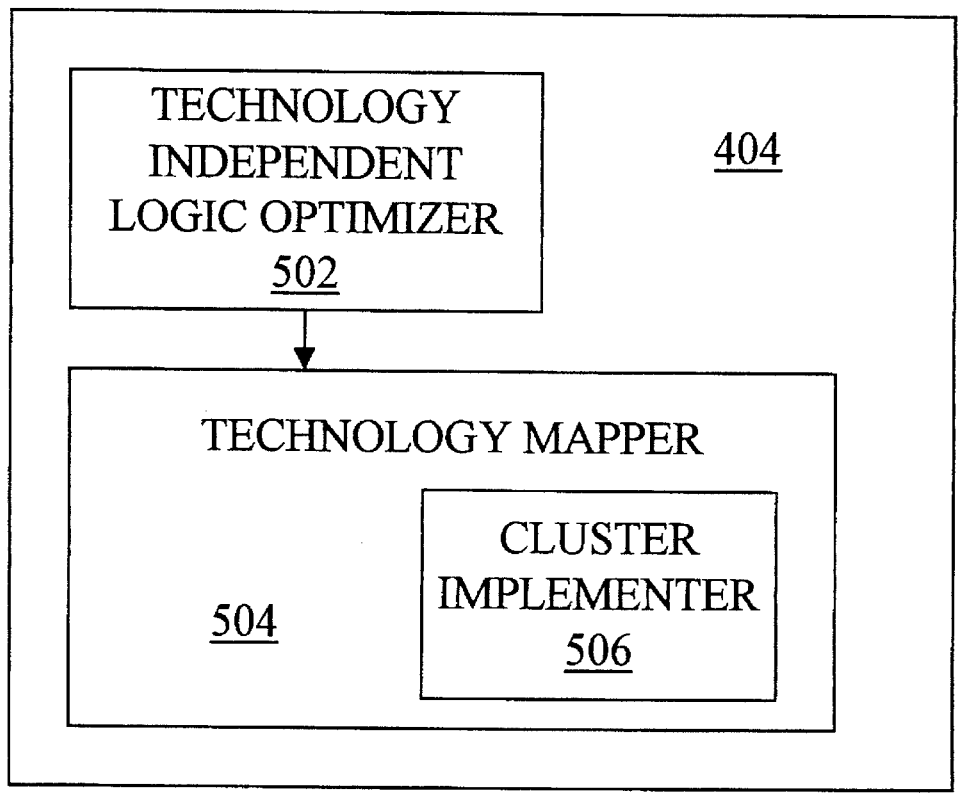
FIG. 5 is a block diagram of a logic optimizer in accordance with the principles of the present invention.

Logic optimizer 404 is shown in greater detail in FIG. 5. Logic optimizer 404 includes a technology-independent logic optimizer 502 which uses Boolean algebra to simplify the logic circuit represented by netlist description 310 (FIG. 4). The result is a simplified logic circuit, which is processed by a technology mapper 504 (FIG. 5) of logic optimizer 404. Technology mapper 504 maps the simplified logic circuit onto one or more macrocells. In mapping the simplified logic circuit onto one or more macrocells, technology mapper 404 maps clusters of one or more interconnected logic gates of the simplified logic circuit onto individual macrocells. The mapping of such clusters is done by a cluster implementer 506, which is included in technology mapper 504 and which is described more completely below.

Figure 6:
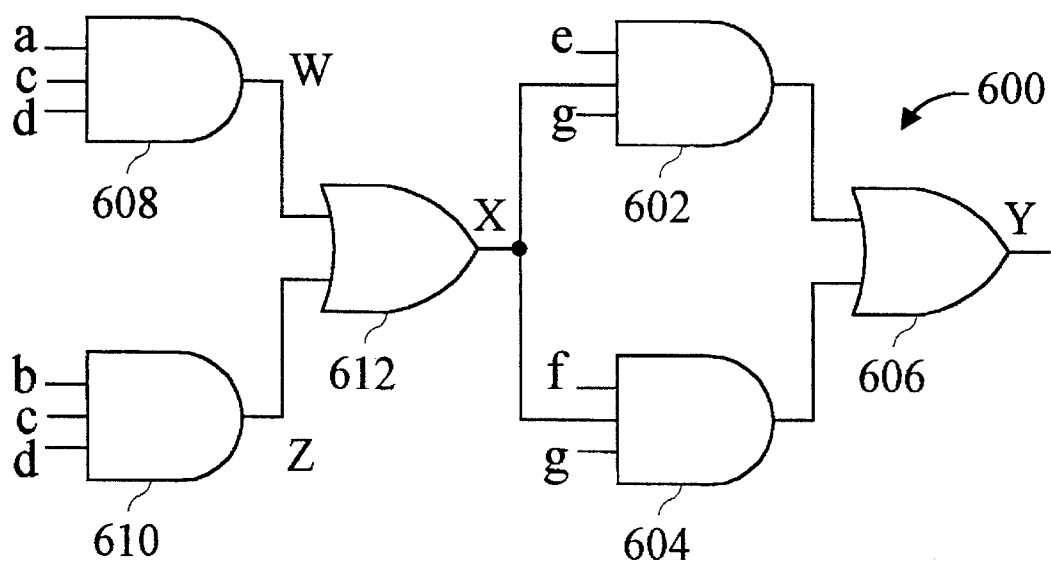
FIG. 6 is an example of a netlist that is not fanout-free.

Technology mapper 504 accepts as input a netlist representing a logic circuit and produces data which is stored in the memory of a computer system and which defines an implementation for that logic circuit on a programmable gate array by specifying connections between the inputs and outputs of one or more macrocells of the array. A netlist is a directed graph whose nodes represent logic gates. The incoming edges to a node represent either input signals to the netlist or the output signals of other nodes. An example of a netlist, which is described more completely below, is illustrated in FIG. 6.

In one embodiment, technology mapper 504 performs the following steps: 1) dividing the global netlist into fanout-free netlists, 2) obtaining implementations for each fanout-free netlist on one or more macrocells and 3) combining the implementations obtained in step (2) into an implementation for the entire netlist. Within step (2) cluster implementer 506 attempts to implement various clusters of gates, each cluster comprising a portion of the netlist, on one macrocell, using select sets of the respective logic functions corresponding to the clusters, as discussed below.

The technique discussed below for the implementation of a netlist onto one or more macrocells assumes that each node, i.e. logic gate, in the netlist can be implemented on one macrocell. To ensure this, a technology mapper must convert the netlist accepted as input into an equivalent netlist expressed in terms of gates that can each be implemented on one macrocell.

This task can be achieved in several ways. One technique involves splitting logic gates in the netlist that cannot be implemented on one macrocell into several logic gates that can. For example, a 12-input AND gate could be split into two 6-input AND gates driving a third 2-input AND gate. Another technique involves applying the library-based technology mapping technique (discussed in the background section) on the netlist accepted as input using a set of pattern graphs corresponding to a group of functions each of which can be implemented on one macrocell. Once the netlist is described using logic gates which can be implemented in a single macrocell, the netlist is mapped onto one or more macrocells.

Implementation of a Cluster on one Macrocell

As described above, cluster implementer 506 (FIG. 5) maps a cluster of one or more interconnected logic gates in a netlist representing a logic circuit, which is to be implemented in an FPD, onto one macrocell of the FPD. A mapping or implementation of a cluster, represented by logic function f, on a macrocell refers to a placement of logic function f's input signals on the input lines of the macrocell, whereby the output signal produced by the macrocell realizes logic function f.

Cluster implementer 506 is shown in greater detail in FIG. 7. Cluster implementer 506 includes a select set generator 702 and a macrocell mapper 704. Select set generator 702 determines a number of select sets of a logic function which represents the cluster of logic gates to be mapped onto a single macrocell. Macrocell mapper 704 uses the select sets to map the cluster of logic gates onto the single macrocell.

Cluster implementer 506 maps a cluster of logic gates, which corresponds to a logic function f, on one macrocell by determining groups of logic function f's input signals, and/or the complements of logic function f's input signals, called select sets. An initial step in the mapping of a logic function onto one macrocell, through the use of select sets, is the transformation of the function into a particular known form called generalized Reed-Muller Form (RMF) (hereinafter simply referred to as Reed-Muller Form). A function in RMF is expressed as the exclusive OR of product terms in single phase, i.e. no input signal appears together with its logical complement in an RMF expression. RMF is a canonical form, i.e. for every logic function of a particular set of input signals of particular phase (an input signal, x, has two phases, uncomplemented, i.e. x, and complemented, i.e. $\bar{x}$) there is a unique RMF expression. For example, if a logic function f has 2 input signals, a and b, there is a unique RMF expression for logic function f in terms of signals a and b, another unique RMF expression for logic function f in terms of signals $\bar{a}$ and b, and so on.

The stages involved in the transformation of a logic function expressed in terms of AND and OR logical operators are as follows ("$\bar{a}$" denotes the logical complement of signal a and $\oplus$ denotes the exclusive-OR operator):

a) Use DeMorgan's Theorem (a+b=$\overline{\bar{a}\ \bar{b}}$) to eliminate all OR operators;

b) Use the identity $\bar{a}$=a$\oplus$1 to eliminate all inversions;

c) Multiply out the expression (e.g. (a$\oplus$b)(c$\oplus$d)= ac$\oplus$bc$\oplus$ad$\oplus$bd); and d) Simplify using a*a=a, a$\oplus$a=0 and a$\oplus$0=a.

An example of a transformation of a logic function into RMF is given by the following: Initially, a logic function, f, is given by $$f=acd+bcd \quad (1)$$

In performing step (a), DeMorgan's Theorem is applied to logic function (1) to form $$f=\overline{\overline{acd}\ \overline{bcd}} \quad (2)$$

Logic function (2) is transformed to the following by three applications of step (b).

$$f=(acd\oplus1)(bcd\oplus1)\oplus1 \quad (3)$$

In step (c), logic function (3) is transformed to the following logic function.

$$f=abcd\oplus bcd\oplus acd\oplus1\oplus1 \quad (4)$$

Logic function (4) is reduced in accordance with step (d) to produce the following logic function expressed in RMF.

$$f=abcd\oplus acd\oplus bcd \quad (5)$$

Generating Select Sets by Co-factor Comparison

As described above, select set generator 702 (FIG. 7) determines a number of select sets of a logic function which represents the cluster of logic gates to be mapped onto a single macrocell. A first embodiment of select set generator 702 is shown in greater detail as select set generator 702A in FIG. 8. Select set generator 702A includes an RMF translator 802, which represents the cluster of logic gates as a logic function expressed in Reed-Muller form, i.e., RMF. The representation in RMF of a logic function corresponding to a cluster of logic gates is described in greater detail above. Select set generator 702A further includes a co-factor comparator 804, which compares co-factors of the logic function in RMF generated by RMF translator 802 to determine the select sets of the logic function in a manner described more completely below.

A select set for a logic function, f, is defined to be a group of f's input signals, and/or the complements of f's input signals, whose corresponding function co-factors are equal, where the group is not wholly contained within another such group. In other words, if {1,2,3} is a select set, then {1,2} is a subset of a select set and thus not a select set itself. The definition of a function's co-factor corresponding to a particular input signal, or complement of an input signal, is discussed below.

One technique of determining the select sets of a logic function, f, with n input signals, involves calculating and then comparing all 2n of f's cofactors, where a co-factor is the logic function obtained by substituting a logical 0 or logical 1 for one of f's input signals. The initial step of reducing an expression for f into RMF facilitates the comparison of f's co-factors by reducing the processing required to reduce respective expressions for the co-factors into a canonical form, such as RMF, prior to the comparison of the co-factors. The respective expressions produced for the co-factors must be converted into some canonical form, such as RMF, to facilitate comparison.

In other embodiments, the initial step of reducing an expression for function f into RMF before determining and comparing cofactors is replaced with a step of reducing an expression for function f into some other canonical form such as BDDs (binary decision diagrams).

The co-factors resulting from the substitution of logical 1 and logical 0 for input signal a are denoted by $f_a$ and $f_{\bar{a}}$ respectively. For example, given the function f=abcd$\oplus$acd$\oplus$bcd, $f_a$=f(a=1)=bcd$\oplus$cd$\oplus$bcd=cd. Similarly, f $_{\bar{a}}$=f(a=0)=0$\oplus$0$\oplus$bcd =bcd. FIG. 9 illustrates the calculations for all 8 of the co-factors of function f. Since $f_a$=$f_b$ and f $_{\bar{c}}$=$f_{\bar{d}}$, {a, b} and {$\bar{c}$, $\bar{d}$} are multivariable select sets of f, i.e. select sets with more than one signal.

The other (univariable) select sets of f are {$\bar{a}$}, {$\bar{b}$}, {c} and {d}. A complete set of select sets for a logic function, f, is defined to contain all the multivariable select sets of the function f, as well as the set {x} or {$\bar{x}$} but not both, for every input signal of logic function f, x, that is not contained, and whose logical complement is not contained, in a multivariable select set of logic function f. For example, the select sets {a, b} and {$\bar{c}$, $\bar{d}$} form a complete set of select sets for the function of FIG. 9.

Knowledge of the select sets of a logic function, f, can help to simplify an implementation for the function. For example, if {a,b,c} is a select set of function f, then by the above-specified definition of select set, $f_a$=$f_b$=$f_c$, i.e. f(a=1)= f(b=1)=f(c=1). Therefore, when considering the role of signals a, b and c in determining the value of function f there are only 2, not 8, possible cases to consider: i.e. the case where at least one of signals a, b and c is a logical one and the case where signals a, b and c are all logical zero. Thus, for example, the impact of signals a, b and c on function f could be captured by the output of an OR gate on whose input lines signals a, b and c are respectively placed. The select sets of function f, once determined, are used to implement function f on a macrocell in a manner described more completely below.

Generating Select Sets from Greedy Phase-minimized RMF

A second embodiment of select set generator 702 (FIG. 7), i.e., select set generator 702B, is shown in FIG. 10. Select set generator 702B includes RMF translator 802, which is described above with respect to FIG. 8, and an RMF greedy phase-minimizer 1002. RMF greedy phase-minimizer 1002 determines the select sets of the RMF logic function generated by RMF translator 802 by performing a greedy phase-minimization of the logic function in the manner described more completely below.

Figure 11:
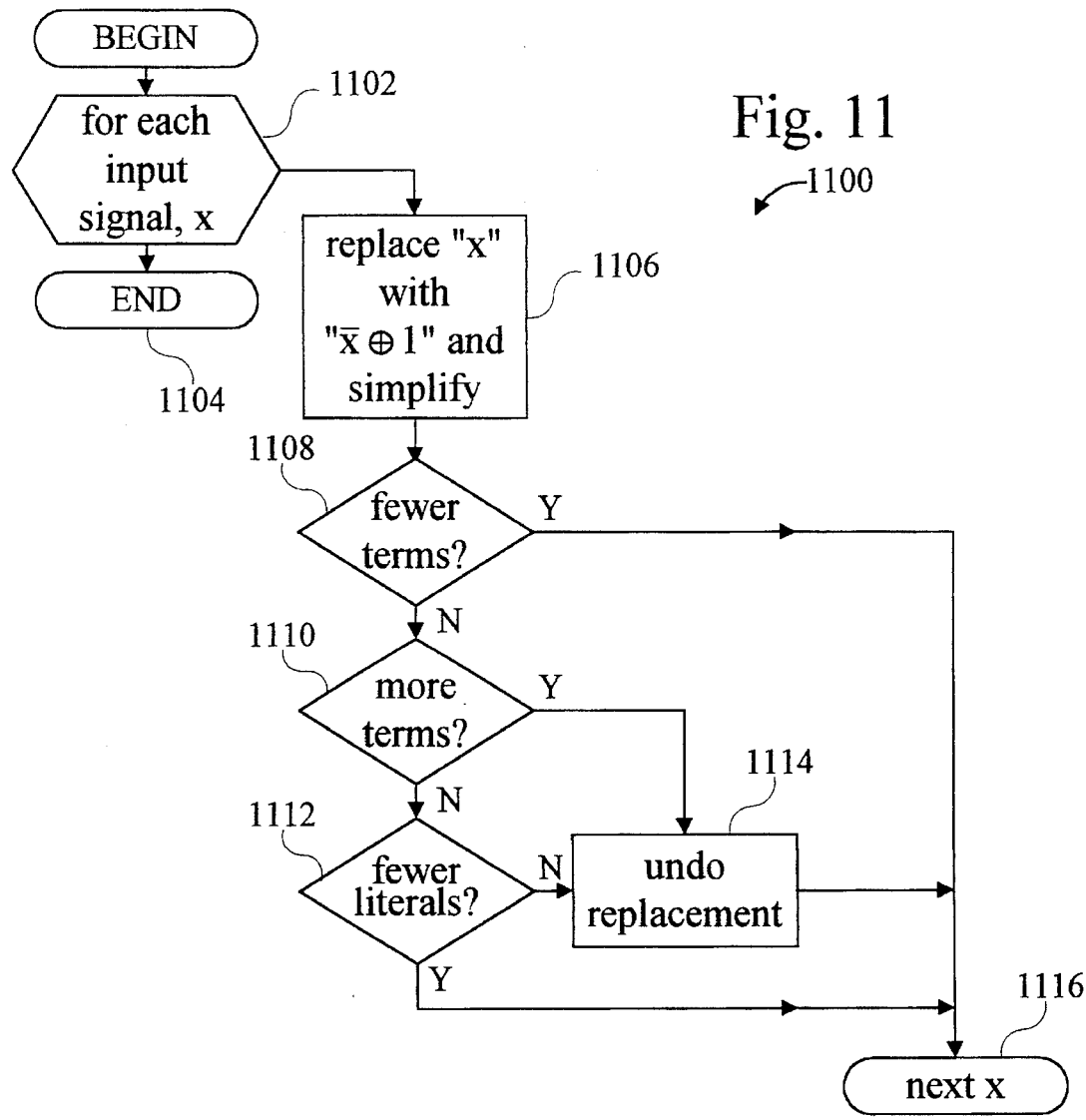
FIG. 11 is a logic flow diagram for the process performed by the RMF greedy phase-minimizer of FIG. 10.

RMF greedy phase-minimizer 1002 attempts to reduce the function in RMF, formed as described above, into a simpler function in RMF by considering the replacement of every function input signal with the complement of the input signal through a process known as greedy phase-minimization. This process is represented by logic flow diagram 1100 (FIG. 11). In particular, the following steps are applied in turn for each input signal, x, of a logic function, f, expressed in RMF in a loop defined by steps 1102 and 1116:

1) In step 1106, RMF greedy phase minimizer 1002 replaces each occurrence of signal x within the current expression for function f with $\bar{x}\oplus 1$ and simplifies the resulting expression for function f by multiplying out product terms and by applying the identities a$\oplus$0=a and a$\oplus$a=0.

2) Processing transfers from step 1106 to test step 1108, where RMF greedy phase-minimizer 1002 determines if the replacement in step 1106 results in fewer terms. A term is the product of one or more signals; for example the expression a+bc has 2 terms. If the replacement results in fewer terms, then the expression for function f remains modified by the replacement in step 1106 and processing transfers to step 1116; otherwise, processing transfers to test step 1110.

3) In test step 1110, RMF greedy phase-minimizer 1002 determines if the replacement in step 1106 results in more terms. If so, processing transfers to step 1114, where the expression for function f is restored to the state of the expression prior to the replacement in step 1106. From step 1114 processing transfers to step 1116. If in test step 1110 it is determined that the replacement in step 1106 does not result in more terms, processing transfers to test step 1112.

4) In test step 1112, RMF greedy phase-minimizer 1002 determines whether the replacement in step 1106 results in a reduction in the number of literals in the expression for function f. If so, then the expression for function remains modified by the replacement in step 1106 and processing transfers to step 1116; otherwise, processing transfers to step 1114, which is described above in greater detail. The number of literals in an expression for a function refers to the number of instances of input signals, not counting instances of logical constants such as logical one, in the expression. For example, the expression ab$\oplus$ac$\oplus$1 has 4 literals, i.e. 2 instances of input signal a and one instance each of input signals b and C.

An example of the simplification of a function, f, in RMF by greedy-phase minimization is shown below where function f=abcd$\oplus$acd$\oplus$bcd, i.e. the function whose co-factors were generated above.

$$f = abcd \oplus acd \oplus bcd \quad (6)$$

First, every occurrence of signal a in the current expression for function f is replaced with $(\bar{a} \oplus 1)$ in step 1106 to obtain the following:

$$\begin{aligned} f &= (\bar{a} \oplus 1) \, bcd \oplus (\bar{a} \oplus 1) \, cd \oplus bcd \\ &= \bar{a}bcd \oplus bcd \oplus \bar{a}cd \oplus cd \oplus bcd \\ &= \bar{a}bcd \oplus \bar{a}cd \oplus cd \end{aligned} \quad (7)$$

The above replacement does not change the number of terms (i.e. still 3 terms); therefore processing transfers through test steps 1108 and 1110 to test step 1112. The replacement reduces the number of literals from 10 in equation (6) to 9 in equation (7). Thus, processing transfers from test step 1112 to step 1116 and the expression for the function remains as modified by this replacement.

In the next iteration of the loop formed by steps 1102 and 1116, every occurrence of input signal b in the current expression for function f is replaced with $(\bar{b} \oplus 1)$ in step 1106 to obtain the following:

$$\begin{aligned} f &= \bar{a}bcd \oplus \bar{a}cd \oplus cd \\ &= \bar{a}(\bar{b} \oplus 1) \, cd \oplus \bar{a}cd \oplus cd \\ &= \bar{a}\bar{b}cd \oplus \bar{a}cd \oplus \bar{a}cd \oplus cd \\ &= \bar{a}\bar{b}cd \oplus cd \end{aligned} \quad (8)$$

Since this replacement decreases the number of terms from 3 in equation (7) to 2 in equation (8), processing transfers through test step 1108 to step 1116 and the expression for function remains as modified by this replacement.

In the next iteration of the loop formed by steps 1102 and 1116, every occurrence of input signal c in the current expression for function f is replaced with $(\bar{c} \oplus 1)$ in step 1106 to obtain the following:

$$\begin{aligned} f &= \bar{a}\bar{b}cd \oplus cd \\ &= \bar{a}\bar{b}(\bar{c} \oplus 1)d \oplus (\bar{c} \oplus 1)d \\ &= \bar{a}\bar{b}\bar{c}d \oplus \bar{a}\bar{b}d \oplus \bar{c}d \oplus d \end{aligned} \quad (9)$$

Since this replacement increases the number of terms from 2 in equation (8) to 4 in equation (9), processing transfers through test steps 1108 and 1110 to step 1114 where the expression for the function is restored to its state prior to the replacement in step 1106 (i.e. to $f = \bar{a}\bar{b}cd \oplus cd$).

In the final iteration of the loop formed by steps 1102 and 1116, every occurrence of input signal d in the current expression for function f is replaced with $(\bar{d} \oplus 1)$ in step 1106 to obtain the following:

$$\begin{aligned} f &= \bar{a}\bar{b}cd \oplus cd \\ &= \bar{a}\bar{b}c(\bar{d} \oplus 1) \oplus c(\bar{d} \oplus 1) \\ &= \bar{a}\bar{b}c\bar{d} \oplus \bar{a}\bar{b}c \oplus c\bar{d} \oplus c \end{aligned} \quad (10)$$

Since this replacement increases the number of terms from 2 in equation (8) to 4 in equation (10), processing transfers through test steps 1108 and 1110 to step 1114, and the expression for the function is restored to its state prior to the replacement in step 1106 (i.e. to $f = \bar{a}\bar{b}cd \oplus cd$).

Each of the input signals of function f has been processed according to the loop of steps 1102 and 1116; therefore processing terminates in terminal step 1104. Thus, the current expression for function f, i.e. $f = \bar{a}\bar{b}cd \oplus cd$, is the greedy phase-minimized RMF expression for function f.

A complete set of select sets for a logic function, f, can be generated by searching for groups of function f's input signals and/or logical complements of function f's input signals that always appear together in the greedy phase-minimized expression for function f. Such groups can be easily determined by sorting the columns of a matrix M, where each row of matrix M represents a different term in the greedy phase-minimized expression for function f and each column represents a different input signal of f in the phase chosen in the greedy phase-minimization process. For example, the matrix, M, corresponding to the greedy phase-minimized RMF function $f = \bar{a}\bar{b}cd \oplus cd$ is given by the following:

$$M = \begin{array}{c|cccc} & \bar{a} & \bar{b} & c & d \\ \text{term 1} & 1 & 1 & 1 & 1 \\ \text{term 2} & 0 & 0 & 1 & 1 \end{array}$$

The matrix element in the ith row and jth column of matrix M is 1 if the input signal corresponding to the jth column appears in the term corresponding to the ith row and 0 otherwise. Note, for example, that the first row of matrix M is 1 1 1 1, since $\bar{a}, \bar{b}$, c and d all appear in the 1st term of the greedy phase-minimized expression for function f.

The logical complements of the input signals associated with identical columns in matrix M form the select sets of function f. Since the columns associated with inputs $\bar{a}$ and $\bar{b}$ are identical, as are the columns associated with inputs c and d, a complete set of select sets for the function f in the above example is $\{\{a, b\}, \{\bar{c},\bar{d}\}\}$.

Implementation of a Logic Function on a Macrocell once Select sets of the Function have been Determined Once select sets have been identified, either by the co-factor generation technique or by the greedy-phase minimization technique as described above, the task of implementing the given logic function on a macrocell remains. In one embodiment, a macrocell 1200 (FIG. 12) includes a 4-to-1 multiplexer 1202 whose two select lines 1204A and 1204B are driven by the output signals of two AND gates 1206A and 1206B, respectively. An implementation of a logic function, f, on such a macrocell can, possibly, be achieved in the following manner if function f does not possess more than two multivariable select sets:

The logical complements of the input signals in each multivariable select set of function f are placed onto the inputs of a separate AND gate and any unused AND gate input lines are set to 1, i.e. connected to a signal with a fixed logical value of one. For example, when implementing the function $f = \bar{a}\bar{b}cd \oplus cd$, (whose multivariable select sets were shown above to be $\{a, b\}$ and $\{\bar{c}, \bar{d}\}$) on 4-to-1 multiplexer 1202, signals $\bar{a}$ and $\bar{b}$ are placed on the input lines of AND gate 1206A and signals c and d are placed on the input lines of AND gate 1206B.

The determination of the signals to be placed on the input lines of multiplexer 1202 is described by way of an illustrative example. Multiplexer input line 1208, which is selected when the output signal of AND gate 1206A is a logical one and the output signal of AND gate 1206B is a logical zero, is considered.

In order for respective output signals of AND gates 1206A and 1206B to have the above specified values, all of the input signals to AND gate 1206A must be a logical one and at least one of the input signals to AND gate 1206B must be a logical zero. Accordingly, the multiplexer input line value is determined by evaluating function f when $\bar{a}=\bar{b}=1$ and (c or d)=0, i.e. $f(\bar{a}=\bar{b}=1 \, \& \, ((c=0) \text{ or } (d=0))) = 0 \oplus 0 = 0$. The calculation of the logical values of the signals on all of the multiplexer input lines and the corresponding implementation of function f on the macrocell of FIG. 12 are shown in FIG. 13.

If the expression determined above for the signal to be placed on any of the multiplexer's input lines had not been reducible to a single input signal of function f or to a logical constant (i.e. logical zero or logical one) then the implementation would not have been achieved.

Figure 12:
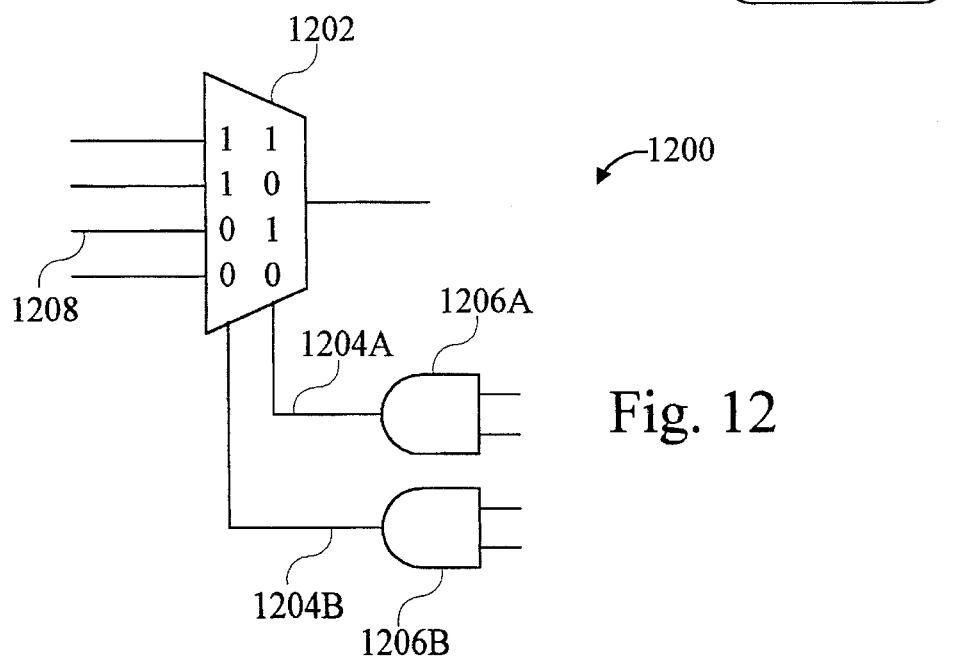
FIG. 12 is a schematic diagram of a macrocell which includes a 4-to-1 multiplexer and two AND gates whose respective outputs each drive a respective one of the select lines of the multiplexer.
Figure 13:
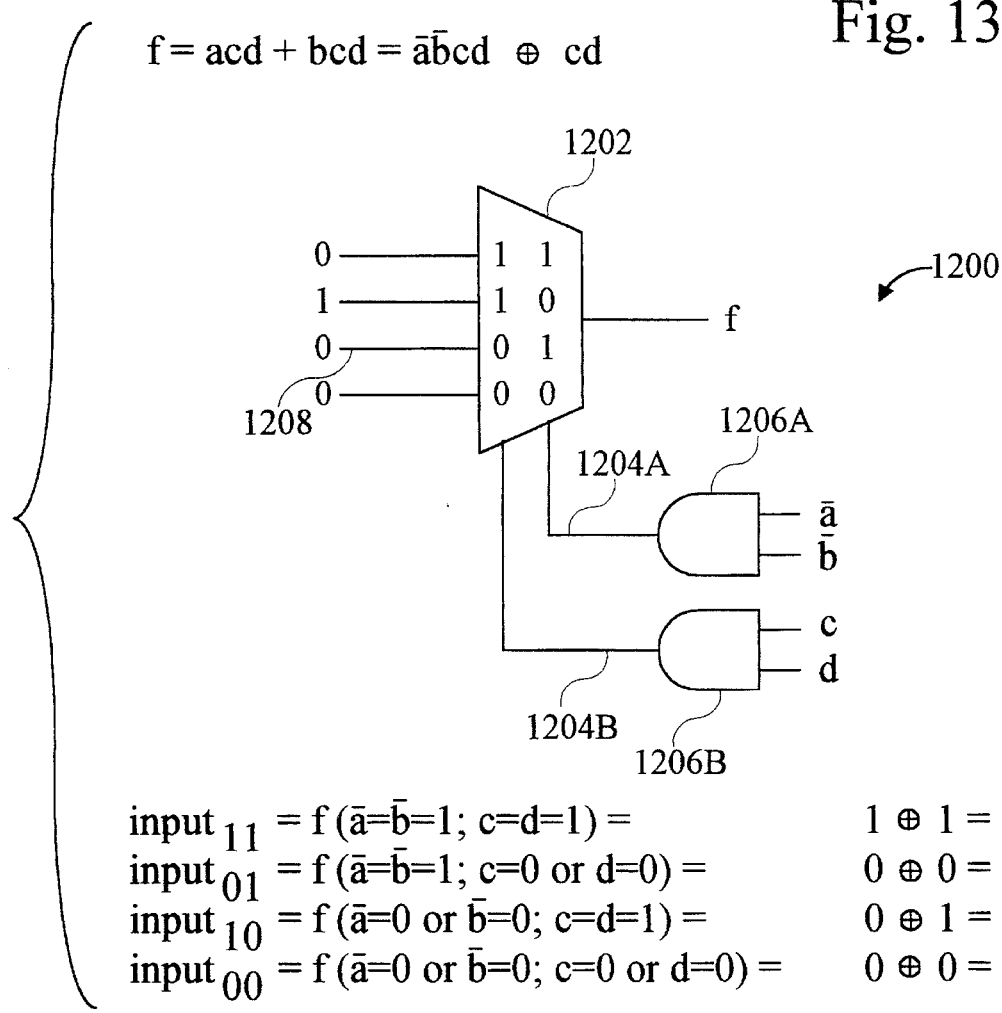
FIG. 13 illustrates the implementation of a logic function on the macrocell of FIG. 12.

The above technique can be applied to map a function f onto the macrocell of FIG. 12 using a complete set of two select sets of function f. The mapping in FIG. 13 is, in fact, an example of this, given that {a, b} and {$\bar{c}$, $\bar{d}$} form a complete set of select sets for the function of FIG. 13.

In another embodiment, a macrocell 1400 (FIG. 14) includes a 4-to-1 multiplexer 1402 whose two select lines 1404A and 1404B are driven by the outputs of OR gates 1406A and 1406B, respectively. An implementation of a logic function f on macrocell 1400 can, possibly, be achieved in the following manner if function f does not possess more than two multivariable select sets:

The input signals in each multivariable select set of function f are placed onto the input lines of a separate OR gate and any unused OR gate input lines are set to logical zero, i.e. connected to a signal with a fixed logical value of zero. For example, when implementing the function f=$\bar{a}$ $\bar{b}$cd⊕cd, whose multivariable select sets were shown above to be {a, b} and {$\bar{c}$, $\bar{d}$}, on 4-to-1 multiplexer 1402, signals a and b are placed on respective input lines of OR gate 1406A and signals $\bar{c}$ and $\bar{d}$ are placed on respective input lines of OR gate 1406B.

The signals placed on the multiplexer input lines in the above example are determined as follows: As an illustrative example. Multiplexer input line 1408, which is selected when the signal on select line 1404A is a logical one and the signal on select line 1404B is a logical zero, is considered.

Figure 15:
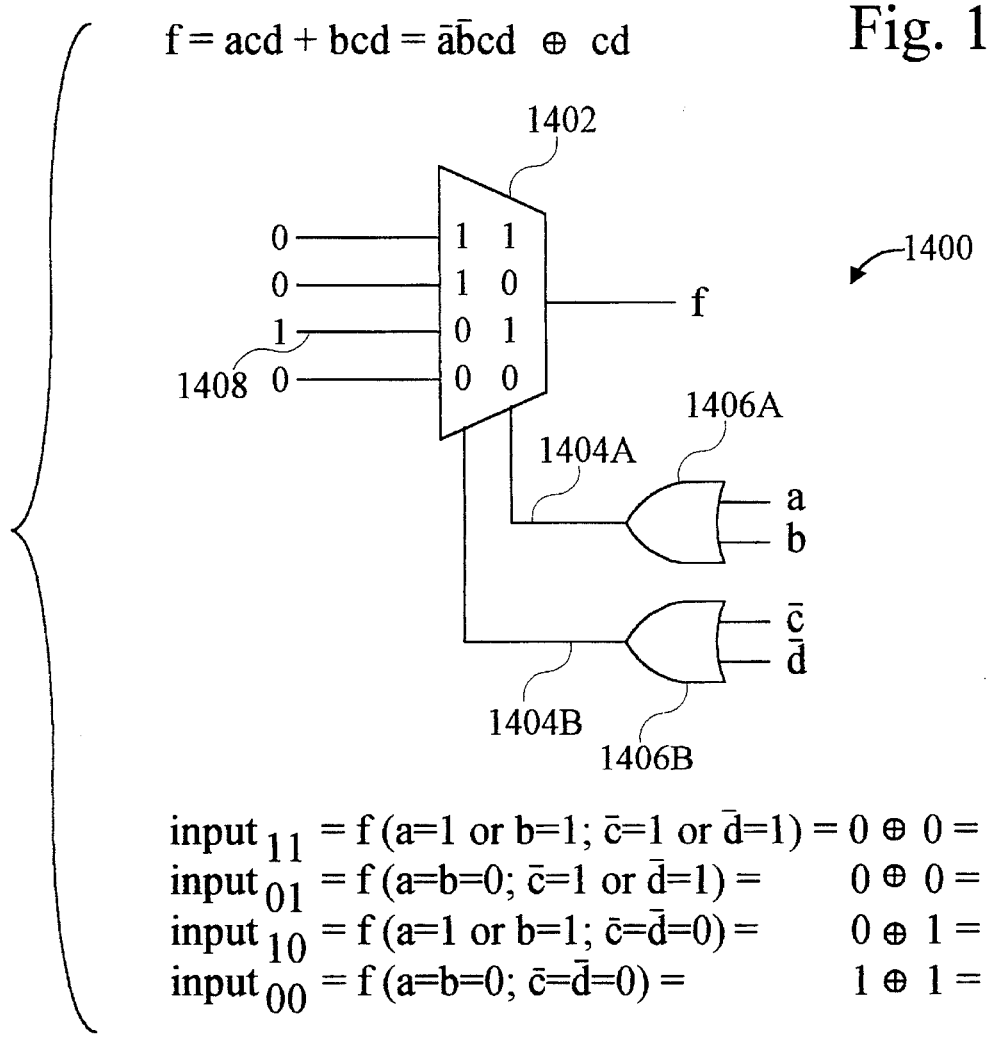
FIG. 15 illustrates the implementation of a logic function on the macrocell of FIG. 14.

In order for select lines 1404A and 1404B to have the above specified values, at least one of the signals applied to an input line of OR gate 1404A must be a logical one and all of the signals applied to the input lines of OR gate 1404B must be a logical zero. Accordingly, the logical value of the signal placed on the above multiplexer input line is determined by evaluating function f when (a or b)=1 and $\bar{c}$=$\bar{d}$=0, i.e. f(((a=1) or (b=1)) & $\bar{c}$=$\bar{d}$=0)=0 ⊕1=1. The calculation of the logical value of the signal placed on each of the input lines of multiplexer 1402 and the corresponding implementation of function f are shown in FIG. 15.

If the expression determined above for the signal to be placed on any of the multiplexer's input lines had not been reducible to a single input signal of function f or to a logical constant (i.e. logical zero or logical one), then the implementation would not have been achieved.

Figure 14:
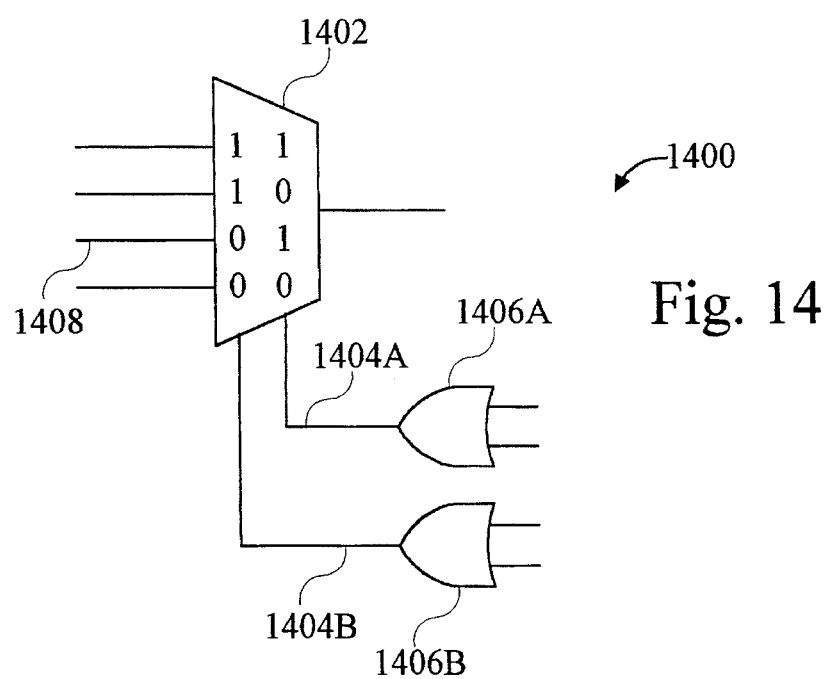
FIG. 14 is a schematic diagram of a macrocell which includes a 4-to-1 multiplexer and two OR gates whose respective outputs each drive a respective one of the select lines of the multiplexer.

The above technique can be applied to map a function f onto the macrocell of FIG. 14 using a complete set of two select sets of function f. The mapping in FIG. 15 is, in fact, an example of this, given that {a, b} and {$\bar{c}$, $\bar{d}$} form a complete set of select sets for the function of FIG. 15.

Figure 16:
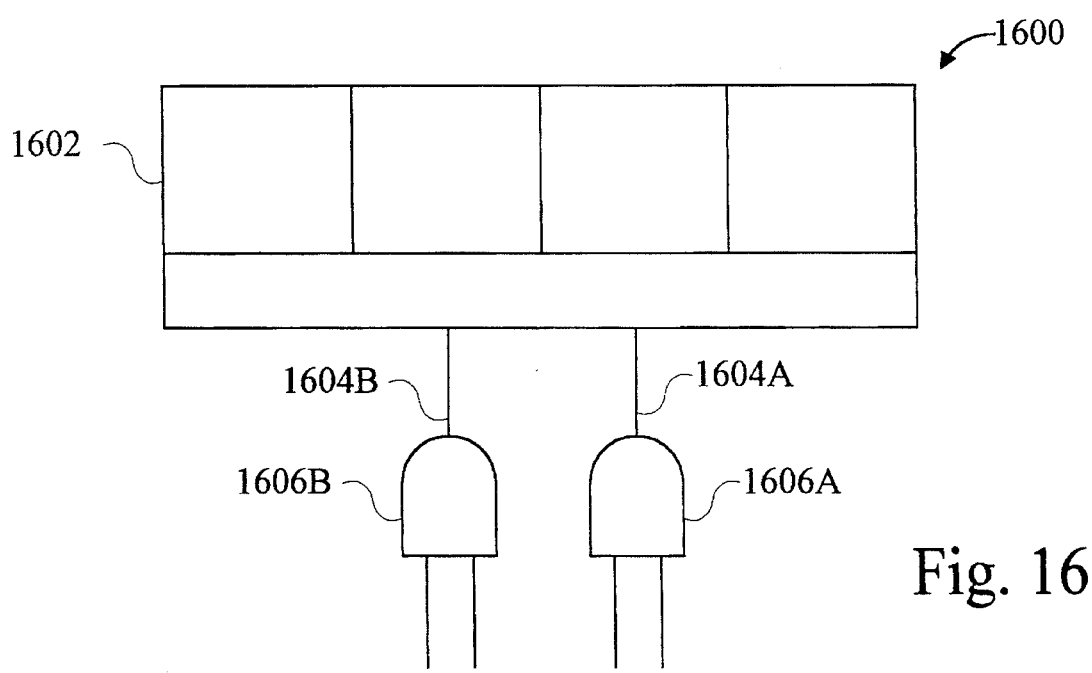
FIG. 16 is a schematic diagram of a macrocell which includes a random access memory (RAM) with four addressable bits and two AND gates whose respective outputs each drive a respective one of the address lines of the RAM.
Figure 17:
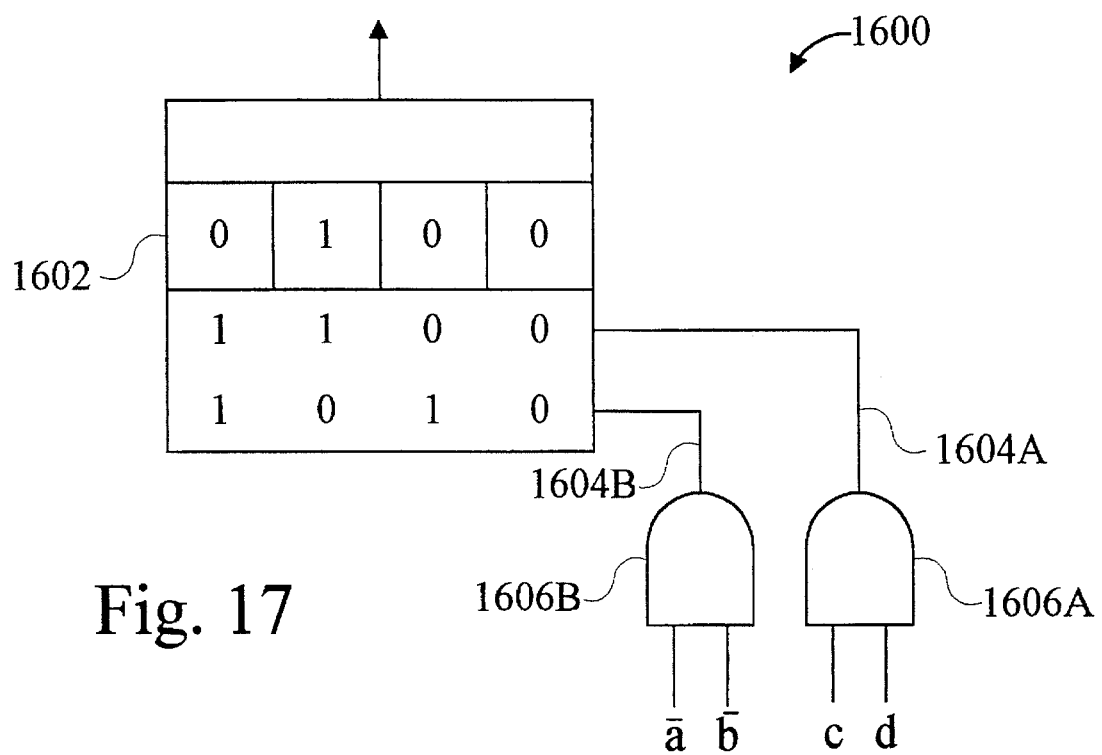
FIG. 17 illustrates the implementation of a logic function on the macrocell of FIG. 16.
Figure 18:
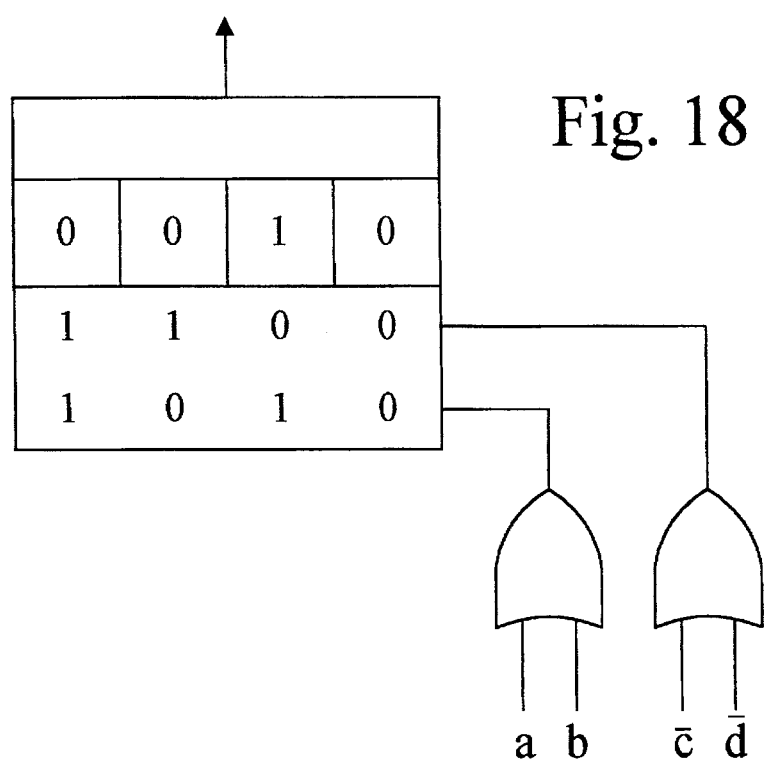
FIG. 18 illustrates the implementation of a logic function on a macrocell which includes a random access memory (RAM) with four addressable bits and two OR gates whose respective outputs each drive a respective one of the address lines of the RAM.

In another embodiment, a macrocell 1600 (FIG. 16) consists of random access memory (RAM) 1602 which contains four 1-bit storage locations and whose two address lines 1604A and 1604B are driven by the outputs of AND gates 1606A and 1606B, respectively. Similar mappings can be obtained on ROM-based modules. The mapping of a logic function, f, possessing a complete set of 2 select sets, onto macrocell 1600 is analogous to the mapping described above in conjunction with macrocell 1200 of FIG. 12. The signal that is placed on a multiplexer input line (which is either a logical zero or logical one, in the case where function f possesses a complete set of 2 select sets) in the latter type of macrocell is stored as a datum in a corresponding RAM cell in macrocell 1600. An implementation on macrocell 1600 of the logic function shown in the example of FIG. 13 is illustrated in FIG. 17. FIG. 18 illustrates the implementation of the same function on a macrocell comprising a RAM whose address lines are driven by the outputs of OR gates.

The principles of the present invention, as discussed above with respect to the macrocells illustrated in FIGS. 12, 14, 17 and 18, respectively, are applicable to macrocells other than those which include a 4-to-1 multiplexer or a 4-bit random access memory. In other embodiments, the macrocell includes a $2^n$-to-1 multiplexer whose n select lines (or address lines) are driven by the output of a respective one of n AND or OR gates, where n is some positive integer. The techniques discussed above and used to obtain the implementations in FIGS. 13 and 15 are equally applicable to the implementation on such a macrocell of a logic function with exactly n multivariable select sets and of a logic function possessing a complete set of n select sets.

An implementation on such a macrocell is also possible for a function with a complete set of i select sets, where i is less than n, by setting the inputs of n-i of the gates driving the select lines of the multiplexer to logical constant signals, thereby effectively turning the $2^n$-to-1 multiplexer into a $2^i$-to-1 multiplexer.

In other embodiments, the macrocell includes a random access memory with $2^n$ 1-bit storage locations whose n address lines are driven by the output of a respective one of n AND or OR gates, where n is some positive integer. The techniques discussed above and used to obtain the implementations in FIGS. 17 and 18 are equally applicable to the implementation on such a macrocell of a logic function with a complete set of n select sets. An implementation is also possible on such a macrocell for a function with a complete set of i select sets, where i is less than n, by setting the inputs of n-i of the gates driving the address lines of the random access memory to logical constant signals, thereby effectively turning the RAM with $2^N$ locations into a RAM with $2^i$ locations.

The above-described technique for mapping a logic function, f, onto a macrocell comprising a $2^n$-to-1 multiplexer can be applied with minor adaptation, which is described below, if function f possesses a complete set of more than n select sets but no more than n of these select sets are multivariable.

To determine whether an implementation is possible, the above-described technique is applied, trying, in any order, every combination of n select sets chosen from the complete set of select sets until all combinations have been tried or an implementation has been achieved. Only combinations containing every multivariable select set are considered. A successful implementation is achieved when the expression calculated for the signal on each multiplexer input line contains no more than one of function f's input signals.

An example of mapping a function possessing a complete set of more than n select sets onto a macrocell containing a $2^n$-to-1 multiplexer and n AND gates can be given by considering the mapping of the function f=ab⊕ac⊕c onto a 2-to-1 multiplexer 1902 (FIG. 19) driven by one AND gate 1906. The select sets of function f are {$\bar{a}$}, {$\bar{b}$} and {$\bar{c}$}, as can be verified by the application of either of the two techniques for select set generation discussed above.

The input signals corresponding to only one of the select sets can be placed on the inputs of AND gate 1906. There are three possibilities to try, i.e. placing input signals a, b, and c, respectively, onto an input line of AND gate 1906. If signal b is placed on an input line of AND gate 1906, the signal to be placed on multiplexer input line 1908A, which is selected when select line 1904 carries a logical value of zero, is f(b=0)=0⊕ac⊕c. Since the expression ac⊕c cannot be reduced to an expression containing only one of function f's input signals, this attempt fails.

Figure 19:
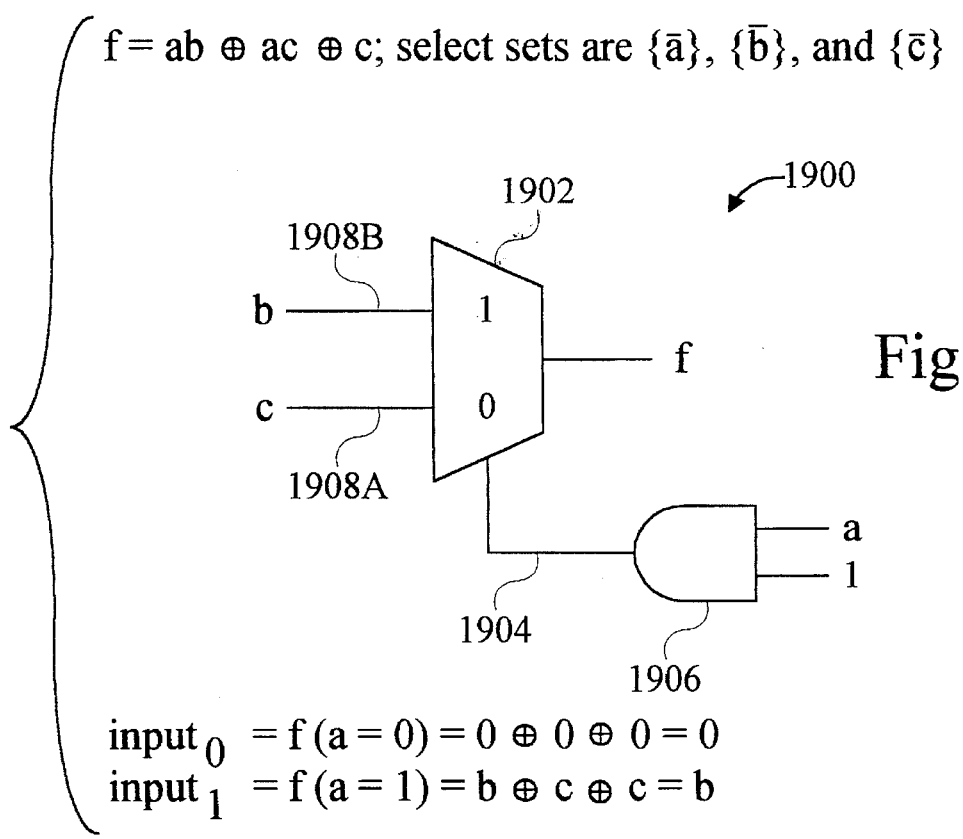
FIG. 19 depicts the implementation of a logic function with three select sets of size one on a macrocell containing a 2-to-1 multiplexor whose select line is driven by the output of an AND gate.

Next, if signal a is placed on an input line of AND gate 1906, then the signals to be placed on multiplexer input lines 1908A and 1908B, respectively, are $f(a=0)=0\oplus 0\oplus c=c$ and $f(a=1)=b\oplus c\oplus c=b$. Since each multiplexer input signal has simplified to an expression containing no more than one of function f's input signals, an implementation has been achieved, as illustrated in FIG. 19.

In another embodiment, a macrocell contains a $2^n$-to-1 multiplexer whose $2^n$ input lines, as well as n select lines, are each driven by the output of a respective logic gate. A logic function with a complete set of more than n select sets (even if the complete set contains more than n multivariable select sets) might be implementable on such a block. The above-described process for implementing a logic function on a macrocell containing a multiplexer with bare input lines is applied using different combinations of n select sets (excluding combinations containing one or more univariable select sets but not all multivariable select sets) chosen from the complete set, to determine the input signals to be placed on the n logic gates driving the select lines of the multiplexer until a successful combination is found or all possible combinations of n select sets have been tried. A successful combination occurs when all of the respective expressions for the signals to be placed on the multiplexer input lines, calculated as discussed above, reduce to a function implementable on the type of logic gate driving the multiplexer input lines.

Figure 20:
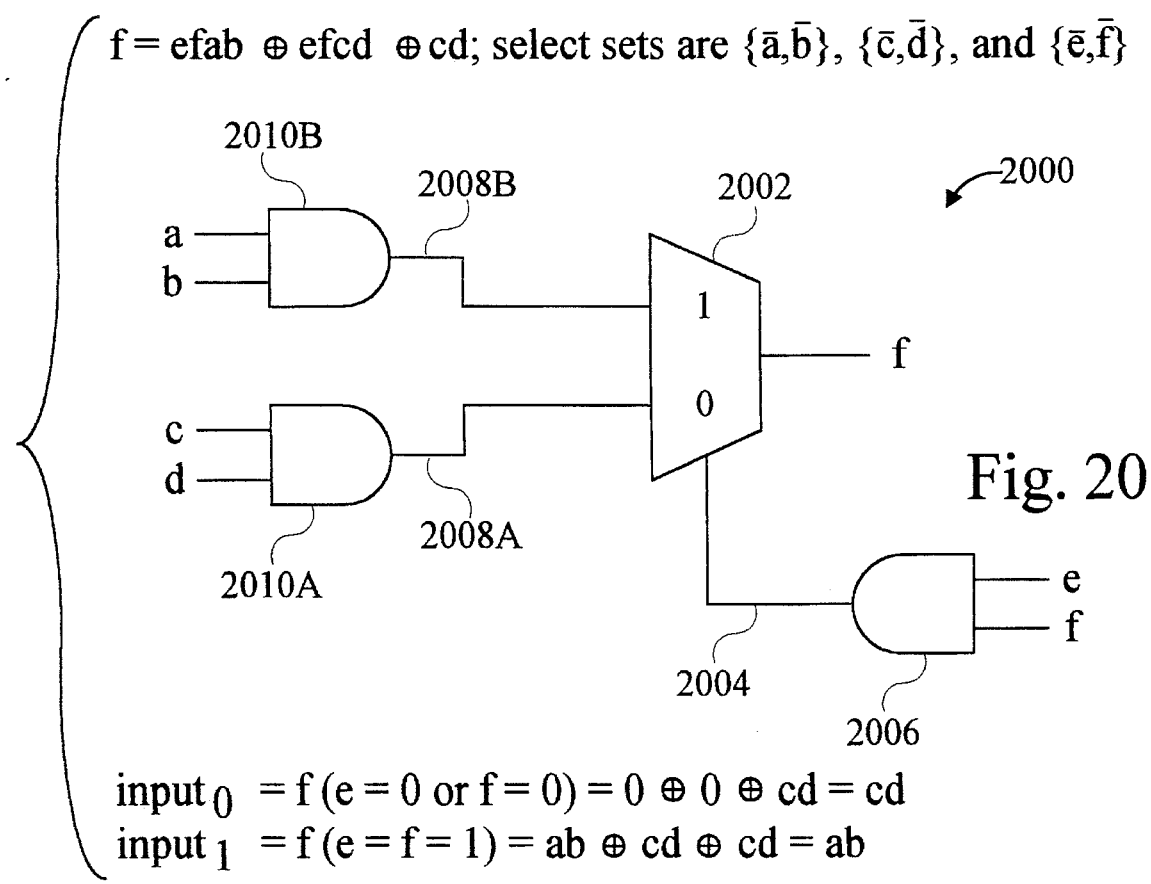
FIG. 20 depicts the implementation of a logic function with three select sets of size two on a macrocell containing a 2-to-1 multiplexor whose select line is driven by the output of an AND gate.

An example of such an implementation on a macrocell 2000 (FIG. 20), which includes a 2-to-1 multiplexer 2002 whose select line 2004 and input lines 2008A and 2008B are driven by the outputs of 2-input AND gates 2006, 2010A, and 2010B, respectively, is illustrated in FIG. 20 for the logic function, $F=efab\oplus efcd\oplus cd$. The multivariable select sets of function F are $\{\bar{a}, \bar{b}\}$, $\{\bar{c}, \bar{d}\}$ and $\{\bar{e}, \bar{f}\}$ as can be verified by either of the two techniques presented above for select set generation. These three select sets form a complete set of select sets since they cover each input signal or its complement.

Only one of the above select sets can determine the input signals to be placed on AND gate 2006. Each select set is considered in turn until an implementation is achieved. The order in which select sets are considered is not critical. Considering first the select set $\{\bar{a}, \bar{b}\}$, i.e. placing signals a and b on respective input lines of AND gate 2006, the expression for the signal to be carried on multiplexer input line 2008A, which is selected when select line 2004 carries a logical value of zero, is $f(a=0 \text{ or } b=0)=0\oplus efcd\oplus cd=efcd\oplus cd$. Since this expression cannot be implemented on a 2-input AND gate, this attempted implementation fails.

Next, the select set $\{\bar{c}, \bar{d}\}$ is considered. When signals c and d are placed on respective input lines of AND gate 2006, the expression for the signal to be carried on multiplexer input line 2008A, which is selected when select line 2004 carries a logical value of zero, is $f(c=0 \text{ or } d=0)=efab\oplus 0\oplus 0=efab$. This expression also cannot be implemented on a 2-input AND gate and thus the attempted implementation corresponding to select set $\{\bar{c}, \bar{d}\}$ also fails.

Finally, the select set $\{\bar{e}, \bar{f}\}$ is considered. When signals e and f are placed on respective input lines of AND gate 2006, the expressions for the respective signals to be carried on multiplexer inputs line 2008A and 2008B are $f(e=0 \text{ or } f=0)=0\oplus 0\oplus cd=cd$ and $f(e=f=1)=ab\oplus cd\oplus cd=ab$. Given that both expressions can be implemented on 2-input AND gates, this attempted implementation succeeds, resulting in the implementation which is illustrated in FIG. 20.

For all the mapping techniques described above, select sets whose size exceeds the number of input lines available on the AND or OR gates contained in the macrocell must be divided into groups small enough to fit on the gates. Such groups are thereafter treated as distinct select sets for the purposes of the mapping techniques described above. For instance, if the macrocell contains 2-input AND or OR gates and $\{a, b, c, d, e, f\}$ is a select set of the function to be mapped then this select set must be split into three sets of size 2, e.g. $\{a, b\}$ $\{c, d\}$ and $\{e, f\}$.

The discussion to this point has assumed that the logical complement of each input signal is available, if necessary, to be placed on an input line of a logic gate driving a select line of a multiplexer or an address line of a random access memory. In some embodiments, some of the input lines of the logic gates driving the select lines of the multiplexer or the address lines of the random access memory are inverted. As well, some of the input lines on the logic gates, if any, driving the input lines of the multiplexer may be inverted. The logical complement of a signal can be supplied to a logic gate merely by placing the signal on an inverted input line. There are known techniques for obtaining the required phases of signals needed as input signals to the macrocells of a programmable gate array. In one embodiment, the required phase of a signal (assuming an inverted input line on a logic gate is not available) is obtained from its logical complement by using part or all of a macrocell to implement the inversion.

The above discussion has focussed on the task of implementing a logic circuit on one macrocell. Many logic circuits are too large to be implemented on one macrocell and must be decomposed into components, each of which can be implemented on one macrocell. The implementation for the overall logic circuit is obtained by combining the respective implementations for the components. The task of implementing a logic circuit on more than one macrocell is discussed in more detail below.

Dividing a Global Netlist into Fanout-free Netlists

An initial step in mapping a netlist representing a circuit design into an array of macrocells involves the decomposition of the netlist (referred to below as the global netlist) into a group of smaller netlists, none of which contains a gate whose output drives more than one gate input. Such netlists are referred to as being fanout-free and are obtained by splitting the entire netlist at the gate outputs driving more than one gate (so-called fanout points). For example, the netlist illustrated in FIG. 6 has one fanout point, namely at signal X, the output of OR gate 612. To eliminate this fanout point, the netlist is split at signal X to yield the two fanout-free netlists 2100 and 2150 shown in FIGS. 21A and 21B, respectively.

Figure 21A:
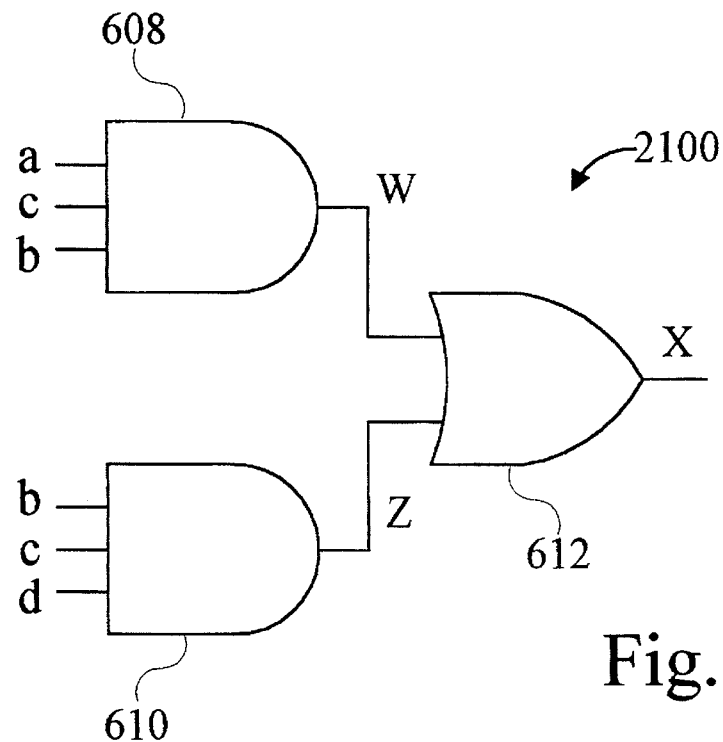
FIG. 21A depicts a first fanout-free component of the netlist of FIG. 6.
Figure 22:
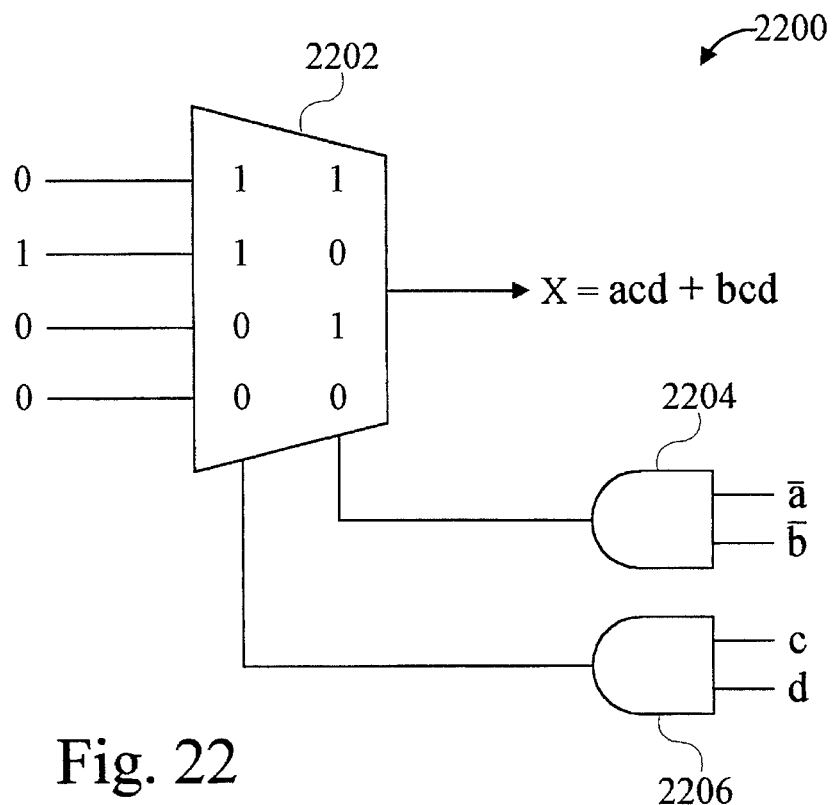
FIG. 22 depicts the implementation of the fanout-free netlist of FIG. 21A on the macrocell of FIG. 12.

After the decomposition of the global netlist into fanout-free parts, each fanout-free netlist is mapped independently and the various mappings are combined to yield a mapping for the global netlist. For example, in order to map netlist 2100 from FIG. 21A the signal $X=acd+bcd$ must be implemented on one or more macrocells. If the macrocell is of the type illustrated in FIG. 12, i.e. a 4-to-1 multiplexer whose select lines are driven by the respective outputs of 2 AND gates, then the signal X can be implemented on one macrocell 2200 (FIG. 22), as was demonstrated above in the discussion concerning FIGS. 12 and 13. The implementation of a fanout-free netlist on one or more macrocells is discussed in greater detail below.

Figure 21B:
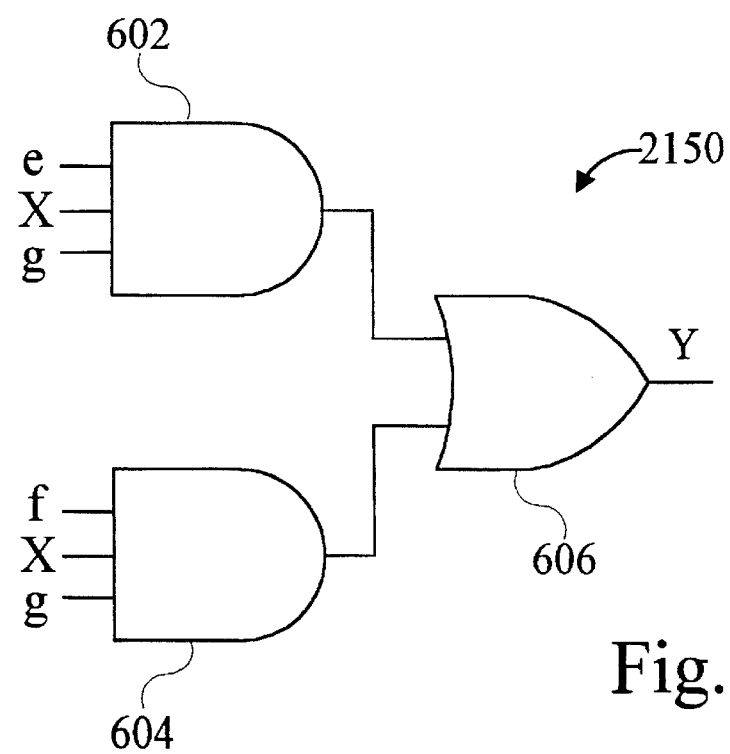
FIG. 21B depicts a second fanout-free component of the netlist of FIG. 6.
Figure 23:
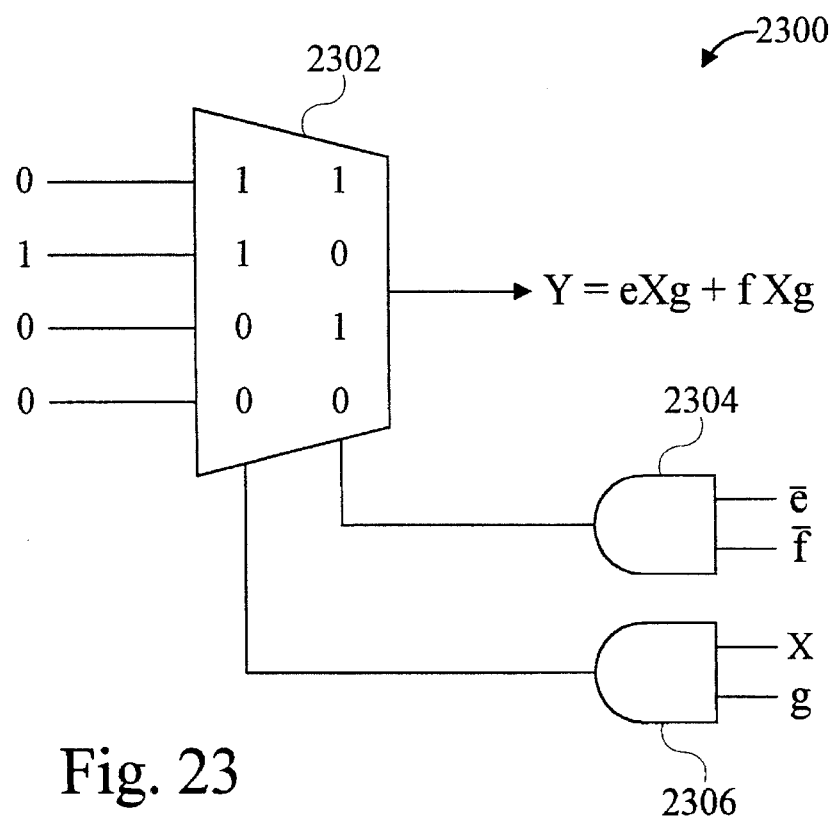
FIG. 23 depicts the implementation of the fanout-free netlist of FIG. 21B on the macrocell of FIG. 12.
Figure 24:
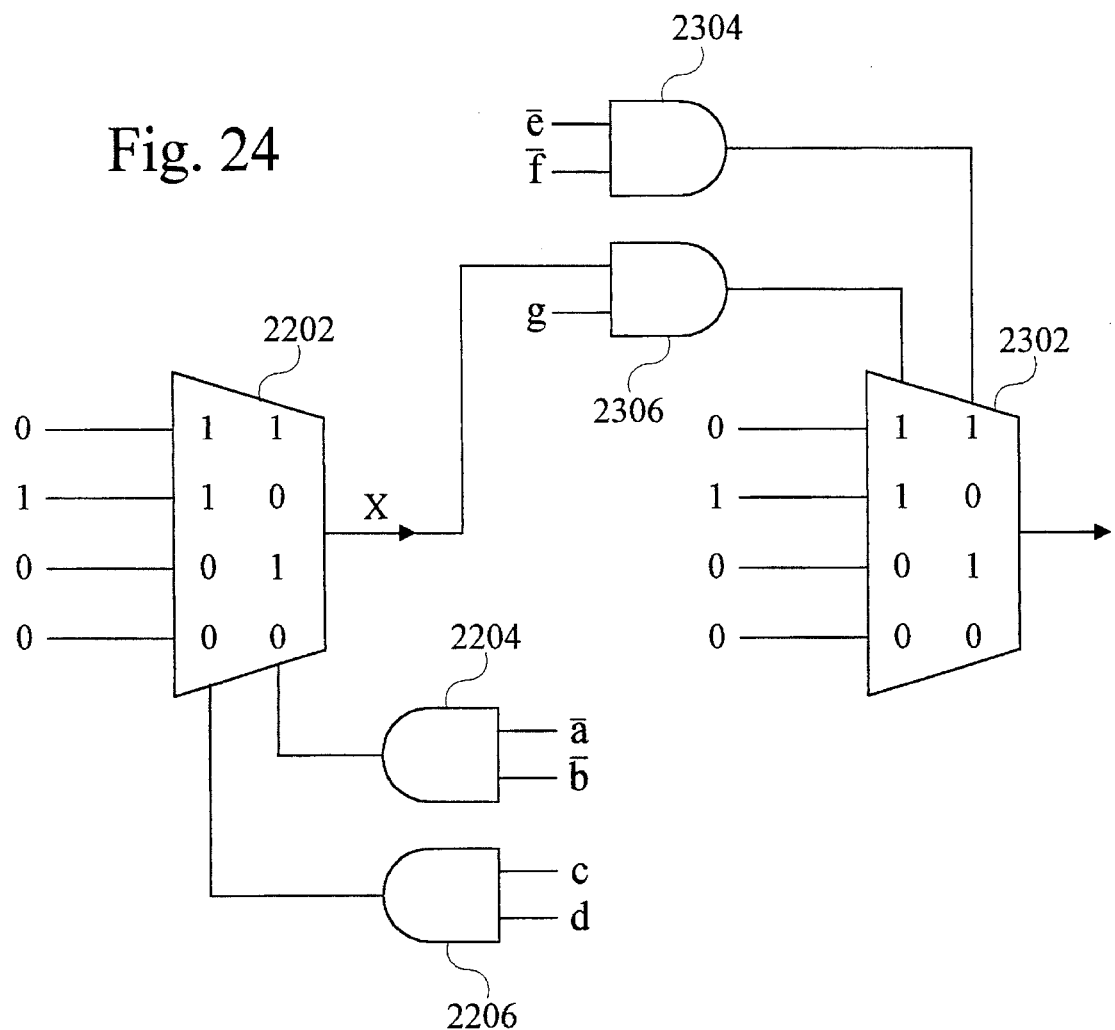
FIG. 24 depicts the implementation of the global netlist of FIG. 6 on two macrocells of the type illustrated in FIG. 12.

The signal $Y=eXg+fXg$, represented by netlist 2150 of FIG. 21B, is identical in form to signal X and is thus similarly implementable in one macrocell 2300 as shown in FIG. 23. The implementation for the global netlist of FIG. 6 is constructed by connecting macrocells 2200 and 2300 as illustrated in FIG. 24.

Implementing a Fanout-free Netlist on one or more Macrocells

After the global netlist has been decomposed into fanout-free netlists, each fanout-free netlist is independently mapped onto one or more macrocells. A fanout-free netlist constitutes a tree whose root node is the gate whose output is that of the entire fanout-free netlist. For example, the root node of netlist 2100 in FIG. 21A is OR GATE 612. The leaf nodes of the tree are defined to be those nodes all of whose inputs are input signals of the global netlist and/or the output signals of other fanout-free portions of the global netlist.

A child of a particular node, x, is a node, y, whose output signal is an input signal to node x. Node x is referred to as the parent of node y. The descendants of a node x include the children of x, the children of the children of x and so on. In other words, the descendants of node x include all nodes that supply, directly or indirectly, an input signal to node x. $T_x$ is used herein to denote the subtree of the fanout-free netlist rooted at node x, i.e. node x and all of its descendants.

Figure 25:
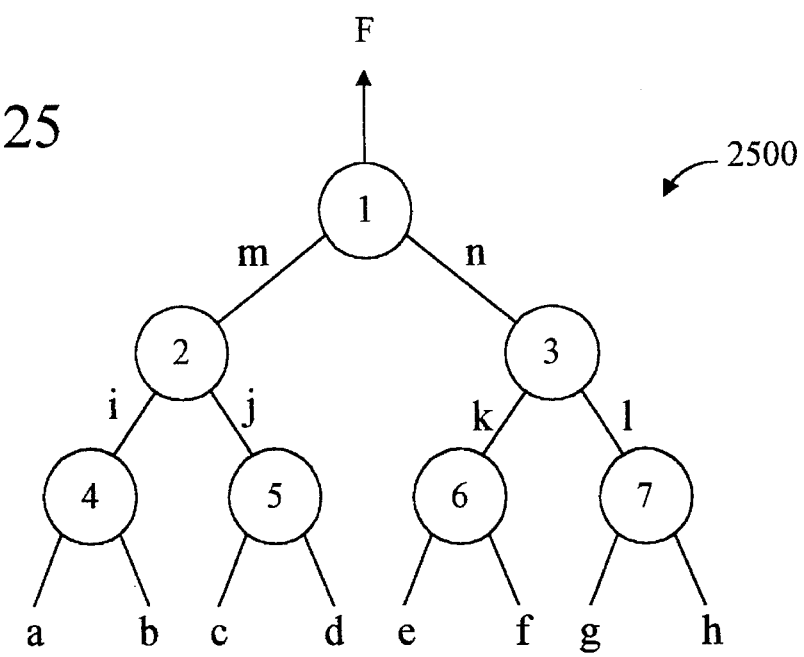
FIG. 25 is a tree representing a fanout-free netlist.

A technique to obtain, for each node x, an implementation for $T_x$ on one or more macrocells is discussed below in reference to a fanout-free netlist 2500 (FIG. 25). All nodes in netlist 2500 correspond to 2-input logic gates, each of which is assumed to be implementable in one macrocell. $BF_i$ is used herein to denote the Boolean function represented at node i. Node 1 is the root node and nodes 4–7 are the leaf nodes. The output of netlist tree 2500 is signal F and the netlist input signals (either primary input signals to the global netlist and/or output signals of other fanout-free portions of the global netlist) are signals a through h.

A dynamic programming technique (i.e. a technique for the solution of a problem using solutions for various components of the overall problem) is used, in one embodiment, to obtain for each node, x, in the tree an implementation on one or more macrocells for $T_x$.

The implementations are obtained in bottom to top order, i.e. for every node a that is the parent of a node b, the implementation for $T_b$ is obtained before that for $T_a$. The last implementation to be obtained is that for the subtree rooted at the root node, i.e. for the entire fanout-free netlist. For example, implementations would be obtained for the following subtrees in netlist 2500 (FIG. 25) in the specified order: $T_4$, $T_5$, $T_6$, $T_7$, $T_2$, $T_3$ and $T_1$.

The implementations are obtained in bottom to top order so that the implementation for the subtree rooted at a particular node, x, can use implementations previously obtained for subtrees rooted at descendants of node x, as is illustrated in the discussion below with respect to FIGS. 25 and 26.

Figure 26:
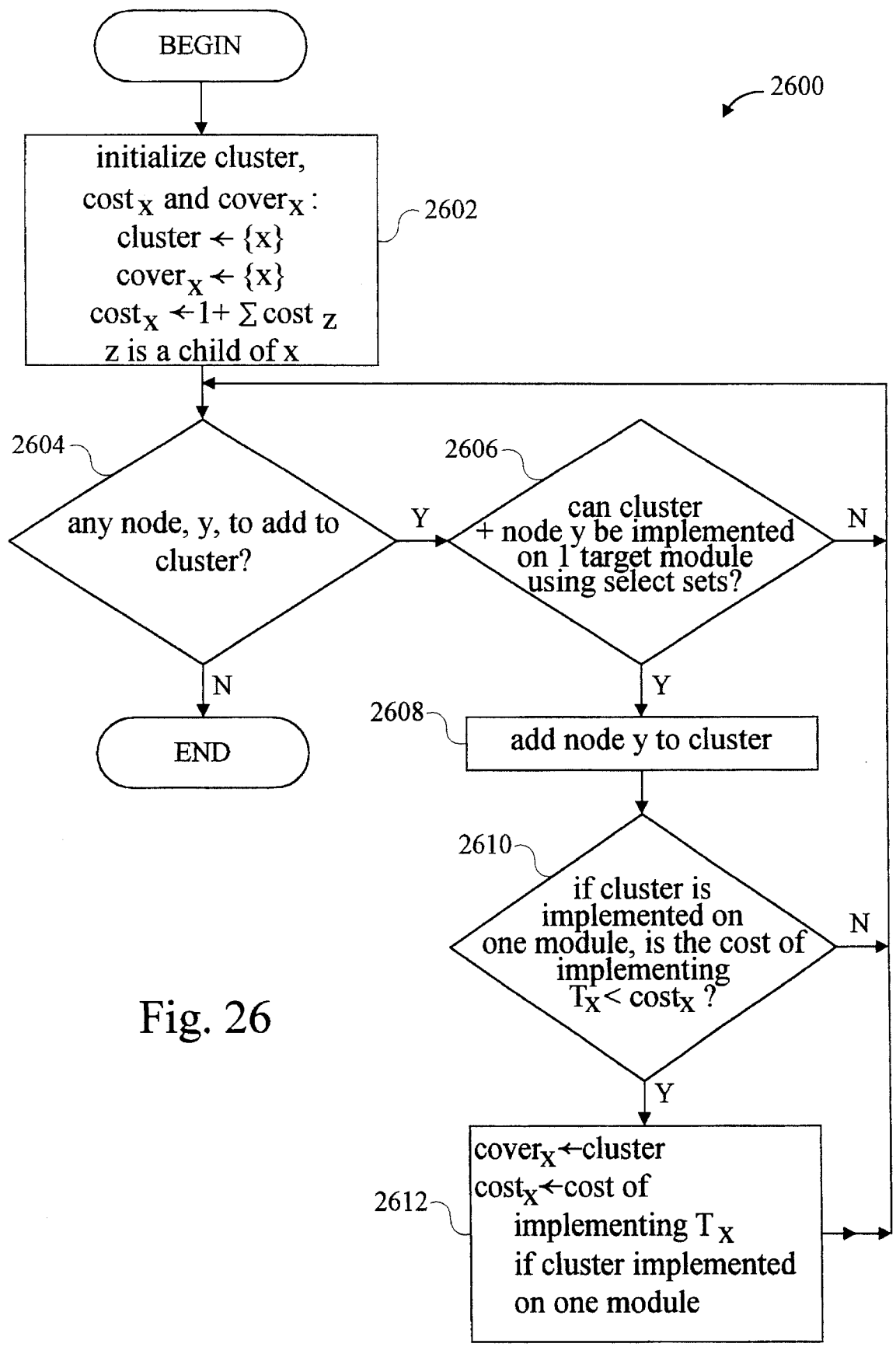
FIG. 26 is a logic flow diagram for determining an implementation on one or more macrocells of the subtree of a netlist whose root is node x.

A technique for implementing $T_x$ (the subtree rooted at non-leaf node x of a fanout-free netlist) on one or more macrocells, given implementations for the respective subtrees rooted at the descendants of node x in the netlist, as performed by technology mapper 504 (FIG. 5) is represented by logic flow diagram 2600 (FIG. 26). Leaf nodes, like all nodes, are assumed to be implementable on one macrocell, as discussed above.

Processing begins with step 2602 in which the cost of implementing the subtree rooted at node x, $cost_x$, is initialized to one plus the sum of the respective costs of implementing the subtrees respectively rooted at each of node x's children. Because of the bottom to top order, discussed above, in which implementations are obtained for the netlist nodes, these latter costs will have been calculated by the time the technique in FIG. 26 is performed to obtain an implementation for $T_x$. The initial value for $cost_x$ corresponds to an implementation for $T_x$ that implements node x by itself in one macrocell and uses the lowest cost implementations previously found for the respective subtrees rooted at each of node x's children.

The cost of an implementation is assumed to be related to the area of the implemented circuit and is thus set to the number of macrocells required for the implementation (i.e. one for a leaf node). In other embodiments in which circuit area is the cost metric and macrocells contain subcomponents that may be used independently, cost may be measured in fractions of macrocells. In other embodiments, other metrics for cost, such as critical path delay, are possible and are commonly used.

In addition, in step 2602, two sets, cluster and $cover_x$, are initialized to the set containing node x. Throughout the processing according to logic flow diagram 2600, the set cluster is the largest cluster of gates, which includes node x and zero or more of the descendants of node x, that has been found to be implementable on one macrocell. Also, throughout the process of logic flow diagram 2600, the set $cover_2$ is the cluster of gates containing node x and zero or more of its descendants that has been found to be implementable on one macrocell and that, among all such clusters so found, results in the lowest cost implementation for $T_x$. $Cost_x$ is the cost of this lowest cost implementation.

Processing transfers from step 2602 to test step 2604 where technology mapper 304 (FIG. 5) determines if there is a node, y, that is a child of a node in the set cluster and whose possible addition to the set cluster has not yet been considered in this step. If there are two or more such nodes, one possible order for choosing y is so-called breadth first search order. The breadth first search order for the nodes in the tree of FIG. 25 is the following: 1, 2, 3, 4, 5, 6, 7. If there is no such node, y, processing according to logic flow diagram 2600 (FIG. 26) terminates. If there is such a node, y, then processing transfers to step 2606.

In test step 2606, technology mapper 504 (FIG. 5) determines if it is possible to implement the nodes in the set cluster together with node y, chosen in step 2604 (FIG. 26), on one macrocell, using the technique based on select sets as discussed above. If an implementation is not achieved in step 2606, processing returns to step 2604, where another node may be considered for possible addition to the set cluster.

If an implementation is achieved in step 2606 then processing transfers to step 2608, where node y is added to the set cluster. From step 2608, processing transfers to test step 2610, where the current value of $cost_x$ is compared with one plus the sum of the respective costs of implementing the subtrees of $T_x$ that remain upon the removal of the nodes in the set cluster from $T_x$. As discussed above, these latter costs are already computed due to the bottom-up order in which the technique of FIG. 26 is applied to the nodes in a netlist. This latter value corresponds to the cost associated with an implementation for $T_x$ that implements all of the nodes in the set cluster on one macrocell and that uses the lowest cost implementations previously determined for the subtrees in $T_x$ remaining in $T_x$ upon the removal of the nodes in the set cluster.

If the former value is greater, processing transfers from test step 2610 to step 2612; otherwise processing transfers to step 2604, where another node is considered for possible addition to the set cluster. In step 2612, $cost_x$ is set to the (lesser) value against which it was compared in test step 2610 and $cover_x$ is set to the current value of the set cluster. Processing transfers from step 2612 to step 2604, which is described above, where another node may be considered for possible addition to the set cluster.

As an example, the application of the steps of logic flow diagram 2600 to the determination of an implementation for $T_1$ in FIG. 25 is considered below. It is assumed that $cost_2$ and $cost_3$, i.e. the respective costs of the implementations previously found for $T_2$ and $T_3$ are 3 and 1, respectively. This implies that the values previously determined for $cover_2$ and $cover_3$ respectively are $\{2\}$ and $\{3,6,7\}$. In step 2602, cluster and $cover_1$ are each initialized to $\{1\}$, and $cost_1$ is initialized to $1+cost_2+cost_3=1+3+1=5$.

Next, the addition of node 2 to the cluster is considered in step 2604. Technology mapper 504 (FIG. 5) then determines if nodes 1 and 2 (FIG. 25), i.e. the function $F=BF_1(BF_2(i,j),n)$, can be implemented on one macrocell using the above-described select-set based technique in step 2606. For example, if $BF_1$ is the 2-input AND function and $BF_2$ is the 2-input OR function, a select-set based attempt to implement the 3-input function, F=(i OR j) AND n, would be made. Assuming that an implementation is possible, node 2 is added to the cluster, i.e. the cluster becomes $\{1,2\}$ in step 2608. Then $cost_x$, i.e. 5, is compared with the cost of implementing $T_1$ if $\{1,2\}$ is implemented on one macrocell, i.e. $1+cost_4+cost_5+cost_3=1+1+1+1=4$ in step 2610. Since $cost_1$ is the greater value, $cost_1$ is set to the value against which cost, was compared in step 2610, i.e. 4, and $cover_1$ is set to $\{1,2\}$ in step 2612.

Processing then transfers to step 2604 where the addition of node 3 to the cluster is considered. Then technology mapper 504 (FIG. 5) determines if the cluster and node 3 (FIG. 25) (i.e. nodes 1, 2 and 3), i.e. the 4-input function $F=BF_1(BF_2(i,j),BF_3(k,l))$, can be implemented on one macrocell in step 2606. Assuming the implementation possible, node 3 is added to the cluster, which thereby becomes $\{1,2,3\}$ in step 2608. Then $cost_1$, i.e. 4, is compared with the cost of implementing $T_1$ if $\{1,2,3\}$ is implemented on one macrocell, i.e. $1+cost_4+cost_5+cost_6+cost_7=1+1+1+1+1=5$ in step 2610. Since $cost_1$ is the lesser value processing transfers to step 2604.

Assuming that no larger cluster than $\{1,2,3\}$ can be implemented on a macrocell, processing will loop through steps 2604 and 2606 four times (during each loop iteration, attempting but failing to implement $\{1,2,3\}$ together with a different one of the leaf nodes on one macrocell) before final termination at which point the value of $cost_1$, i.e. 4, indicates the cost of the lowest cost implementation found for $T_1$. The final value of $cover_1$, i.e. $\{1,2\}$, indicates that in this lowest cost implementation nodes 1 and 2 are implemented together on one macrocell. Nodes 4 and 5 are each implemented on one macrocell and nodes 3, 6 and 7 are implemented together on one macrocell.

The computer program in Microfiche Appendix A was compiled and linked, in one embodiment, using the Microsoft C version 8.0 compiler, available from Microsoft Corporation of Redmond, Wash., which had access to the Win32s libraries and header files, also provided by Microsoft. A library directory is created by issuing the following command of the DOS operating system, which is also available from Microsoft Corporation, when the current path is a directory containing the files included in Microfiche Appendix A.

```
nmake /f wt32s.mak                                    (11)
```

Figure 1:
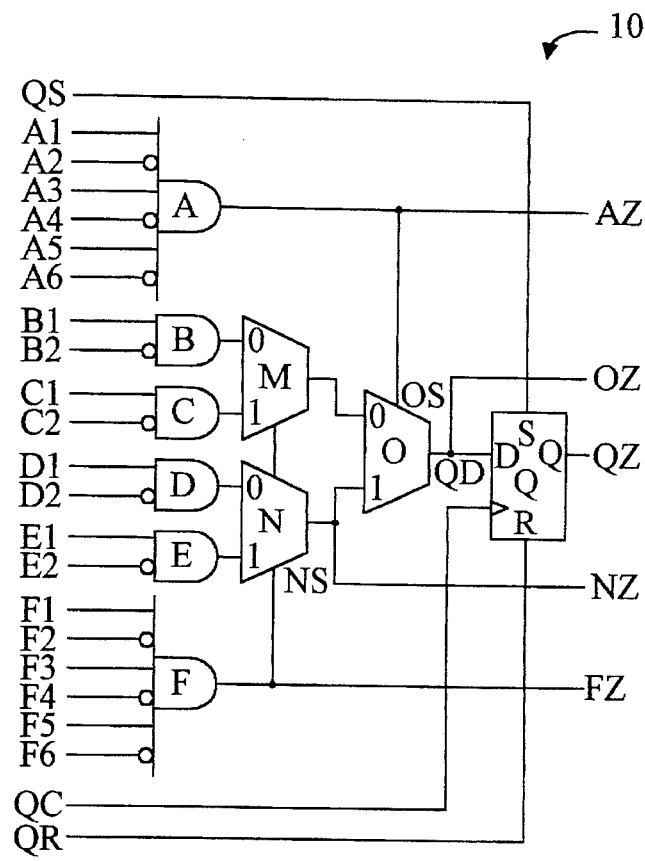
FIG. 1 depicts a pASIC macrocell used in an FPD sold by QuickLogic Corporation.
Figure 2:
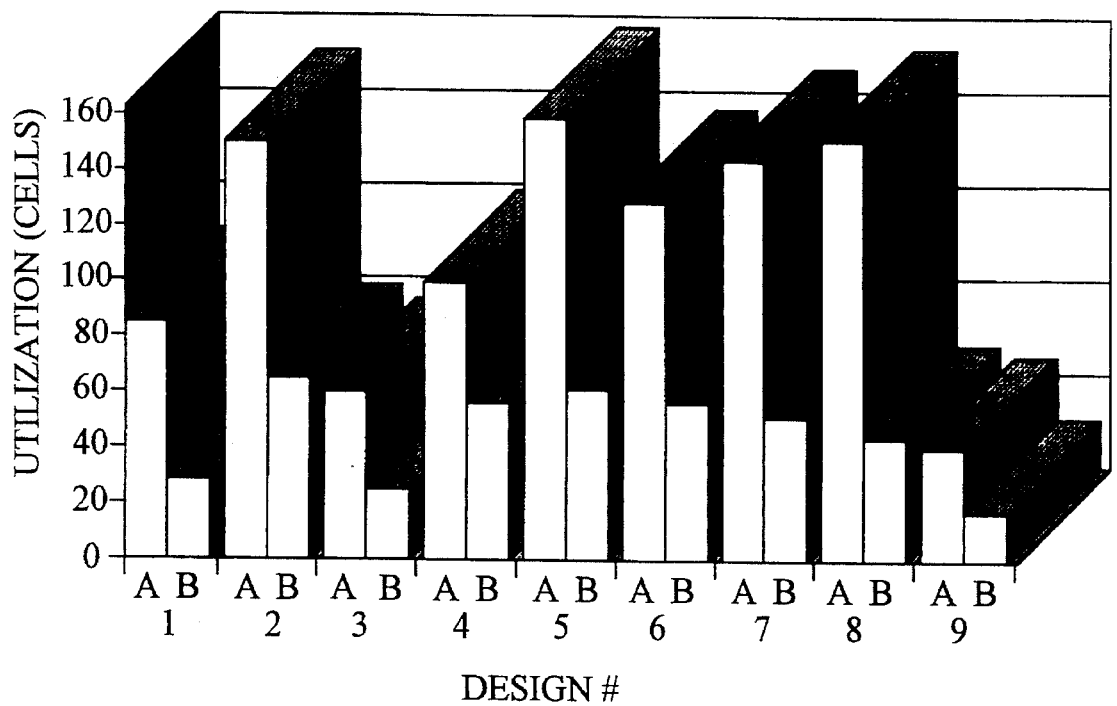
FIG. 2 is a chart comparing the number of pASIC macrocells used to implement each of nine circuit designs when a library-based technology mapping technique is used and the number of pASIC macrocells used when a select set-based mapping technique is applied to the implementation produced by the library-based technique.

The result is a library, which is named qlwt.lib and which can be linked with other object code modules to form executable computer programs which, when executed, perform the technology mapping described above by appropriate calls to procedures defined in the source code of Microfiche Appendix A. Such resulting executable computer programs map circuits described in QDIF file format, as described in Appendix D of the *pASIC Toolkit User's Guide* (January 1993, QuickLogic Corporation) onto one or more macrocells of the type displayed in FIG. 1. An unnumbered page of Michofiche Appendix A is positioned between pages 81 and 82 of Microfiche Appendix A and should be numbered page 81A. Page 81A of Microfiche Appendix A should be read after page 81 and before page 82 of Microfiche Appendix A. The particular computer language and the computer system used are not an essential aspect of this invention. In view of this disclosure, those skilled in the art can implement the invention using a different computer language and/or a different computer system.

We claim:

1. A method of implementing a logic circuit with one output line capable of carrying an output signal on a macrocell of a programmable gate array, comprising the steps of:

determining one or more select sets of a logic function representing the output signal of said logic circuit. at least one of said select sets having at least one inverted variable; and determining an implementation, based on said one or more select sets, for said logic circuit on said macrocell.

2. The method of claim 1 further comprising the step of storing programmable gate array programming data which define the implementation of the logic circuit on the macrocell.

3. The method of claim 2 further comprising the step of programming said programmable gate array to realize said implementation.

4. A method of implementing a logic circuit, with one output line capable of carrying an output signal, on a macrocell of a programmable gate array, comprising the steps of:

determining one or more select sets of a logic function representing a transformation from one or more input signals of the logic circuit to the output signal of the logic circuit, the step of determining one or more select sets comprising:

(a) converting the logic function into a first expression in Reed-Muller form;

(b) performing greedy phase-minimization on the first expression to produce a second expression; and (c) forming one or more groups of input signals and/or logical complements of input signals, where the members of each group always appear together in the second expression; and determining an implementation, based on said select sets, for said logic circuit on said macrocell.

5. The method of claim 1 wherein the logic function represents a transformation from one or more input signals to an output signal; and further wherein the step of determining the select sets comprises:

generating the univariable co-factors of the logic function corresponding to each of the input signals and to the complements of the input signals; and grouping input signals and/or complements of input signals whose corresponding univariable cofactors are equal.

6. The method of claim 1 wherein the macrocell comprises one or more logic gates, each having an output line, and a multiplexer which includes select lines, each of which is driven by the output line of a respective one of said logic gates.

7. The method of claim 6 wherein said logic gates are distinct AND gates;

further wherein the number of logic gates and the number of select lines is N;

further wherein the number of said select sets is no more than N; and further wherein the step of determining an implementation comprises the following steps:
  (i) for each of the select sets, placing the logical complements of the signals contained in the select set on the input lines of a respective one of the AND gates; and
  (ii) for each of the input lines of the multiplexer, placing on the input line of the multiplexer the output signal produced by the logic circuit when logical one is the value of each of the signals placed in step (i) on one of said AND gates whose output carries a logical value of one if the input line of the multiplexer is selected and when logical zero is the value of at least one signal in each group of signals placed in step (i) on one of said AND gates whose output carries a logical value of zero if the input line of the multiplexer is selected.

8. The method of claim 6 wherein said logic gates are distinct AND gates;

further wherein the number of logic gates and the number of select lines is N;

further wherein the number of said select sets is greater than N; and further wherein the step of determining an implementation comprises the following steps:
  (i) choosing a combination of N select sets chosen from said one or more select sets;
  (ii) for each of said N chosen select sets, placing the logical complements of the signals contained in the chosen select set on input lines of a respective one of the AND gates;
  (iii) for each input line of the multiplexer, placing on the input line of the multiplexer the signal that is output by the logic circuit when logical one is the value of each of the signals placed in step (ii) on one of said AND gates whose output carries a logical value of one if the input line of the multiplexer is selected and when logical zero is the value of at least one signal in each group of signals placed in step (ii) on one of said AND gates whose output carries a logical value of zero if the input line of the multiplexer is selected.

9. The method of claim 8 further comprising the steps of:
  (iv) determining that step (iii) cannot be performed using logic circuitry, which is coupled to the input lines of the multiplexer; and
  (v) repeating steps (i), (ii) and (iii), choosing in step (i) a combination not chosen in a previous performance of step (i), if there is a combination of N select sets that has not been chosen in a previous performance of step (i).

10. The method of claim 6 wherein said logic gates are distinct OR gates;

further wherein the number of logic gates and the number of select lines is N;

further wherein the number of said select sets is no more than N; and further wherein the step of determining an implementation comprises the following steps:
  (i) for each of the select sets, placing the signals contained in the select set on the input lines of a respective one of the OR gates; and
  (ii) for each of the input lines of the multiplexer, placing on the input line of the multiplexer the output signal produced by the logic circuit when logical zero is the value of each of the signals placed in step (i) on one of said OR gates whose output carries a logical value of zero if the input line of the multiplexer is selected and when logical one is the value of at least one signal in each group of signals placed in step (i) on one of said OR gates whose output carries a logical value of one if the input line of the multiplexer is selected.

11. The method of claim 6 wherein said logic gates are distinct OR gates;

further wherein the number of logic gates and the number of select lines is N;

further wherein the number of said select sets is greater than N; and further wherein the step of determining an implementation comprises the following steps:
  (i) choosing a combination of N select sets chosen from said one or more select, sets;
  (ii) for each of said N chosen select sets, placing the signals contained in the chosen select set on the input lines of a respective one of the OR gates;
  (iii) for each input line of the multiplexer, placing on the input line of the multiplexer the signal that is output by the logic circuit when logical zero is the value of each of the signals placed in step (ii) on one of said OR gates whose output carries a logical value of zero if the input line of the multiplexer is selected and when logical one is the value of at least one signal in each group of signals placed in step (ii) on one of said OR gates whose output carries a logical value of one if the input line of the multiplexer is selected.

12. The method of claim 11 further comprising the steps of:
  (iv) determining that step (iii) cannot be performed using logic circuitry, which is coupled to the input lines of the multiplexer; and
  (v) repeating steps (i), (ii) and (iii), choosing in step (i) a combination not chosen in a previous performance of step (i), if there is a combination of N select sets that has not been chosen in a previous performance of step (i).

13. The method of claim 1 wherein the macrocell comprises one or more logic gates, each having an output line, and a memory which includes one or more address lines, each of which is driven by the output line of a respective one of said logic gates.

14. The method of claim 13 wherein said logic gates are distinct AND gates, further wherein the number of logic gates and the number of address lines is N;

further wherein the number of said select sets is no more than N; and further wherein the step of determining an implementation comprises the following steps:
  (i) for each of the select sets, placing the logical complements of the signals contained in the select set on the input lines of a respective one of the AND gates; and (ii) in each of the storage locations of the random access memory, storing the signal output by the logic circuit when logical one is the value of each of the signals placed in step (i) on one of said AND gates whose output carries a logical value of one if the storage location of the random access memory is selected and when logical zero is the value of at least one signal in each group of signals placed in step (i) on one of said AND gate whose output carries a logical value of zero if the storage location of the random access memory is selected.

15. The method of claim 13 wherein said logic gates are distinct OR gates, further wherein the number of logic gates and the number of address lines is N;

further wherein the number of said select sets is no more than N; and further wherein the step of determining an implementation comprises the following steps:

(i) for each of the select sets, placing the signals contained in the select set on the input lines of a respective one of the OR gates; and (ii) in each of the storage locations of the random access memory, storing the signal output by the logic circuit when logical zero is the value of each of the signals placed in step (i) on one of said OR gates whose output carries a logical value of zero if the storage location of the random access memory is selected and when logical one is the value of at least one signal in each group of signals placed in step (i) on one of said OR gates whose output carries a logical value of one if the storage location of the random access memory is selected.

16. An apparatus for implementing a logic circuit, with one output line capable of carrying an output signal, on a macrocell of a programmable gate array, comprising:

means for determining one or more select sets having at least one inverted variable of a logic function representing the output signal of said logic circuit; and means for determining an implementation, based on said selects sets having at least one inverted variable, for said logic circuit on said macrocell.

17. A technology mapper for implementing a logic circuit on a macrocell of a programmable logic device, the technology mapper comprising:

a select set generator for forming one or more select sets having at least one inverted variable of a logic function which represents a transformation from one or more input signals of the logic circuit to an output signal of the logic circuit; and a macrocell mapper, operatively coupled to the select set generator, for implementing the logic circuit on the macrocell according to the select sets having at least one inverted variable generated by the select set generator.

18. A cluster implementer used in a technology mapper, the cluster implementer comprising:

a select set generator for forming one or more select sets of a logic function which represents a transformation from one or more input signals of the logic circuit to an output signal of the logic circuit, the select set generator comprising a Reed-Muller translator for deriving from a first expression of the logic function a second expression of the logic function in Reed-Muller form; and a macrocell mapper, operatively coupled to the select set generator, for implementing the logic circuit on the macrocell according to the select sets generated by the select set generator.

19. The technology mapper of claim 17 wherein the select set generator further comprises:

a univariable co-factor comparator for generating, for each input signal of the logic circuit and for the complement of each input signal of the logic circuit, a corresponding unvariable co-factor.

20. The technology mapper of claim 19 wherein the univariable co-factor comparator compares a first univariable co-factor, which corresponds to a first signal that is a first input signal or the logical complement of the first input signal, to a second univariable co-factor, which corresponds to a second signal that is a second input signal or the logical complement of the second input signal, and includes the first and second signals in a single select set if the first and second univariable co-factors are equal.

21. The cluster implementer of claim 18 wherein the select set generator further comprises:

an RMF greedy phase-minimizer, operatively coupled to the RMF translator, for deriving from the second expression a third expression in greedy phase-minimized RMF.

22. The cluster implementer of claim 21 wherein the third expression comprises one or more terms, each of which comprises one or more literals which each correspond to a particular phase of a particular one of the input signals of the logic circuit;

further wherein the select set generator further comprises:

means, operatively coupled to the RMF greedy phase-minimizer, for determining select sets by grouping one or more literals that always appear in the third expression.

23. A technology mapping system for implementing a logic circuit on a programmable logic device, the system comprising:

a programmable logic device programmer; and a technology mapper, operatively coupled to the programmable logic device programmer, comprising a select set generator for forming one or more select sets having at least one inverted variable of a logic function which represents a transformation from one or more input signals of at least a portion of the logic circuit to an output signal of the portion of the logic circuit; and a macrocell mapper, operatively coupled to the select set generator, for implementing the portion of the logic circuit on a macrocell of the programmable logic device according to the select sets having at least one inverted variable generated by the select set generator.

24. The method of claim 7 wherein the select sets constitute a complete set of select sets.

25. The method of claim 8 wherein the select sets constitute a complete set of select sets.

26. The method of claim 10 wherein the select sets constitute a complete set of select sets.

27. The method of claim 11 wherein the select sets constitute a complete set of select sets.

28. The method of claim 14 wherein the select sets constitute a complete set of select sets.

29. The method of claim 15 wherein the select sets constitute a complete set of select sets.

30. The method of claim 1 wherein the macrocell comprises one or more distinct AND gates each of which has one or more input lines; and further wherein the step of determining an implementation comprises:

for each of the select sets, placing the logical complements of the signals contained in the select set on the input lines of a respective one of the AND gates.

31. The method of claim 1 wherein the macrocell comprises one or more distinct OR gates each of which has one or more input lines; and further wherein the step of determining an implementation comprises:

for each of the select sets, placing the signals contained in the select set on the input lines of a respective one of the OR gates.

32. A method of implementing a logic circuit on a programmable device, said logic circuit having an output line capable of carrying an output signal, said method comprising the steps of:

determining one or more select sets of a logic function representing a transformation from one or more input signals of the logic circuit to the output signal of the logic circuit, the step of determining one or more select sets comprising:

(a) converting the logic function into a first expression in Reed-Muller form;

(b) performing greedy phase-minimization on the first expression to produce a second expression, wherein the second expression comprises one or more terms, each of the terms comprising a product of one or more literals and each of the literals corresponding to a particular phase of a particular one of the input signals of the logic circuit; and (c) grouping said literals into one or more select sets, wherein a first of said literals is placed into the same select set as a second of said literals if: 1) the second literal is present in each of the terms of the second expression in which the first literal is present; and 2) the second literal is not present in any of the terms of the second expression in which the first literal is not present; and determining an implementation, based on said select sets, for said logic circuit on said programmable device.

* * * * *